(12) United States Patent
Tanaka et al.

(10) Patent No.: US 11,901,389 B2
(45) Date of Patent: Feb. 13, 2024

(54) INFRARED SENSOR AND IMAGING APPARATUS

(71) Applicant: NEC Corporation, Tokyo (JP)

(72) Inventors: Tomo Tanaka, Tokyo (JP); Kimiyoshi Fukatsu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 449 days.

(21) Appl. No.: 17/325,308

(22) Filed: May 20, 2021

(65) Prior Publication Data

US 2021/0375974 A1 Dec. 2, 2021

(30) Foreign Application Priority Data

May 26, 2020 (JP) .................. 2020-091375

(51) Int. Cl.
*H01L 27/146* (2006.01)
*H01L 23/00* (2006.01)
*H04N 5/33* (2023.01)
*H01L 25/18* (2023.01)
*H04N 25/79* (2023.01)

(52) U.S. Cl.
CPC ...... *H01L 27/14636* (2013.01); *H01L 23/562* (2013.01); *H01L 24/05* (2013.01); *H01L 24/06* (2013.01); *H01L 24/16* (2013.01); *H01L 24/17* (2013.01); *H01L 25/18* (2013.01); *H01L 27/14649* (2013.01); *H04N 5/33* (2013.01); *H04N 25/79* (2023.01); *H01L 2224/05554* (2013.01); *H01L 2224/06131* (2013.01); *H01L 2224/16227* (2013.01); *H01L 2224/17132* (2013.01); *H01L 2924/12043* (2013.01)

(58) Field of Classification Search
None
See application file for complete search history.

(56) References Cited

FOREIGN PATENT DOCUMENTS

| JP | H07-111323 A | | 4/1995 | |
|---|---|---|---|---|
| JP | WO2018131216 | * | 9/2017 | ........... H01L 27/144 |
| JP | 2018-092169 A | | 6/2018 | |

* cited by examiner

*Primary Examiner* — David P Porta
*Assistant Examiner* — Meenakshi S Sahu
(74) *Attorney, Agent, or Firm* — Sughrue Mion, PLLC

(57) ABSTRACT

An infrared sensor including: a detection substrate that includes a first substrate in which infrared detection elements are arranged in a lattice shape and first terminals each of which is associated with one of the infrared detection elements are arranged; a readout substrate that includes a second substrate in which second terminals each of which is associated with one of the first terminals are arranged and a readout circuit that reads an electrical signal based on infrared light detected by each one of the infrared detection elements is formed; and bumps that electrically connect each one of the first terminals to one of the second terminals associated with the one of the first terminals, in which at least one of the first terminals, the second terminals, or the bumps is partially arranged at a position between the infrared detection elements that are adjacent in a top view.

10 Claims, 19 Drawing Sheets

INFRARED SENSOR AND IMAGING APPARATUS

This application is based upon and claims the benefit of priority from Japanese Patent Application No. 2020-091375, filed on May 26, 2020, the disclosure of which is incorporated herein in its entirety by reference.

TECHNICAL FIELD

The present invention relates to an infrared sensor for detecting infrared light and the like.

BACKGROUND ART

A commonly used infrared sensor has a structure formed by flip-chip bonding of a substrate on which a detection unit including infrared detection elements for detecting infrared light arranged in a lattice shape is formed and a substrate on which a readout circuit is formed. For example, a material of the substrate on which the detection unit is formed is a compound semiconductor such as gallium arsenide (GaAs), and a material of the substrate on which the readout circuit is formed is silicon (Si). Each one of the plurality of elements (also referred to as pixels) included in the detection unit is connected to one of circuits subsequent to the readout circuit on a one-to-one basis by a metal bump. Thus, a plurality of the bumps connecting the detection unit and the readout circuit are arranged in a lattice shape in accordance with the plurality of pixels.

A quantum infrared camera is used while being cooled with liquid helium or liquid nitrogen. Thus, warpage is likely to be generated in an infrared sensor due to a difference in thermal expansion coefficient between a substrate on which infrared detection elements are formed (also referred to as a detection substrate) and a substrate on which a readout circuit is formed (also referred to as a readout substrate). In a case where warpage has been generated in the detection substrate and the readout substrate, a crack is likely to be generated in the detection substrate that has a relatively thin form. In a case where a crack has been generated in the detection substrate, an image captured by the quantum infrared camera is partially blurred.

PTL 1 (JP 2018-092169 A) discloses a display device including a substrate, conductive pads arranged on the substrate over a plurality of rows, and a drive circuit chip including bumps arranged over a plurality of rows to be electrically connected with the conductive pads. In the display device of PTL 1, a plurality of bumps arranged in the same row and each associated to one of a plurality of conductive pads are arranged such that positions of ends in a gravity or column direction are arranged in a zigzag form to be shifted from each other in the column direction between adjacent bumps.

In the method of PTL 1, adjacent bumps are arranged in a staggered manner in the column direction. Thus, in the method of PTL 1, cracks or damage are less likely to be generated on the substrate when the drive circuit chip is mounted due to factors such as pressure and temperature generated during the mounting process. According to the method of PTL 1, as for the plurality of conductive pads constituting the same row, warpage and cracks can be reduced by shifting the bumps on the conductive pads. However, according to the method of PTL 1, it has not been possible to reduce warpage and cracks generated between conductive pads.

PTL 2 (JP H07-111323 A) discloses a method of manufacturing a hybrid device in which a plurality of elements two-dimensionally arranged on a compound semiconductor crystal and an integrated circuit for processing signals from the elements are electrically and mechanically joined by using a plurality of bumps. The manufacturing method of PTL 2 includes two steps. The first step is a step of forming bumps on each of the compound semiconductor crystal and the integrated circuit so that the bumps on the compound semiconductor crystal may be formed at a pitch larger than that of the bumps on the integrated circuit. The second step is a step of heating and expanding each of the compound semiconductor crystal and the integrated circuit at a different temperature and joining them with the pitch of the bumps on the compound semiconductor crystal and that on the integrated circuit coincide with each other.

According to the method of PTL 2, at liquid nitrogen temperature (77 Kelvin), which is the operating temperature of the device, the distance between both ends of a pixel array on the compound semiconductor crystal becomes smaller than the distance between both ends of a pixel array on the integrated circuit, and this causes the bumps to be strained. According to the method of PTL 2, the strain during cooling is reduced by the amount of offset by the strain at room temperature, and this reduces deterioration of diode characteristics caused by stress due to the strain during cooling. However, in the method of PTL 2, the bumps are distorted both at room temperature and during cooling, and there has been a possibility that warpage may be generated in the device also at room temperature.

An object of the present invention is to provide an infrared sensor or the like that can reduce warpage of a substrate on which infrared detection elements are formed.

SUMMARY

An infrared sensor of one aspect of the present application includes a detection substrate that includes a first substrate in which a plurality of infrared detection elements are arranged in a lattice shape and a plurality of first terminals each of which is associated with one of the infrared detection elements are arranged; a readout substrate that includes a second substrate in which a plurality of second terminals each of which is associated with one of the plurality of first terminals are arranged and a readout circuit that reads an electrical signal based on infrared light detected by each one of the plurality of infrared detection elements is formed; and a plurality of bumps that electrically connects each one of the plurality of first terminals to one of the plurality of second terminals associated with the one of the plurality of first terminals, in which at least one of the plurality of first terminals, the plurality of second terminals, or the plurality of bumps is partially arranged at a position between the infrared detection elements that are adjacent in a top view.

BRIEF DESCRIPTION OF THE DRAWINGS

Exemplary features and advantages of the present invention will become apparent from the following detailed description when taken with the accompanying drawings in which.

EXAMPLE EMBODIMENT

Figure 1:
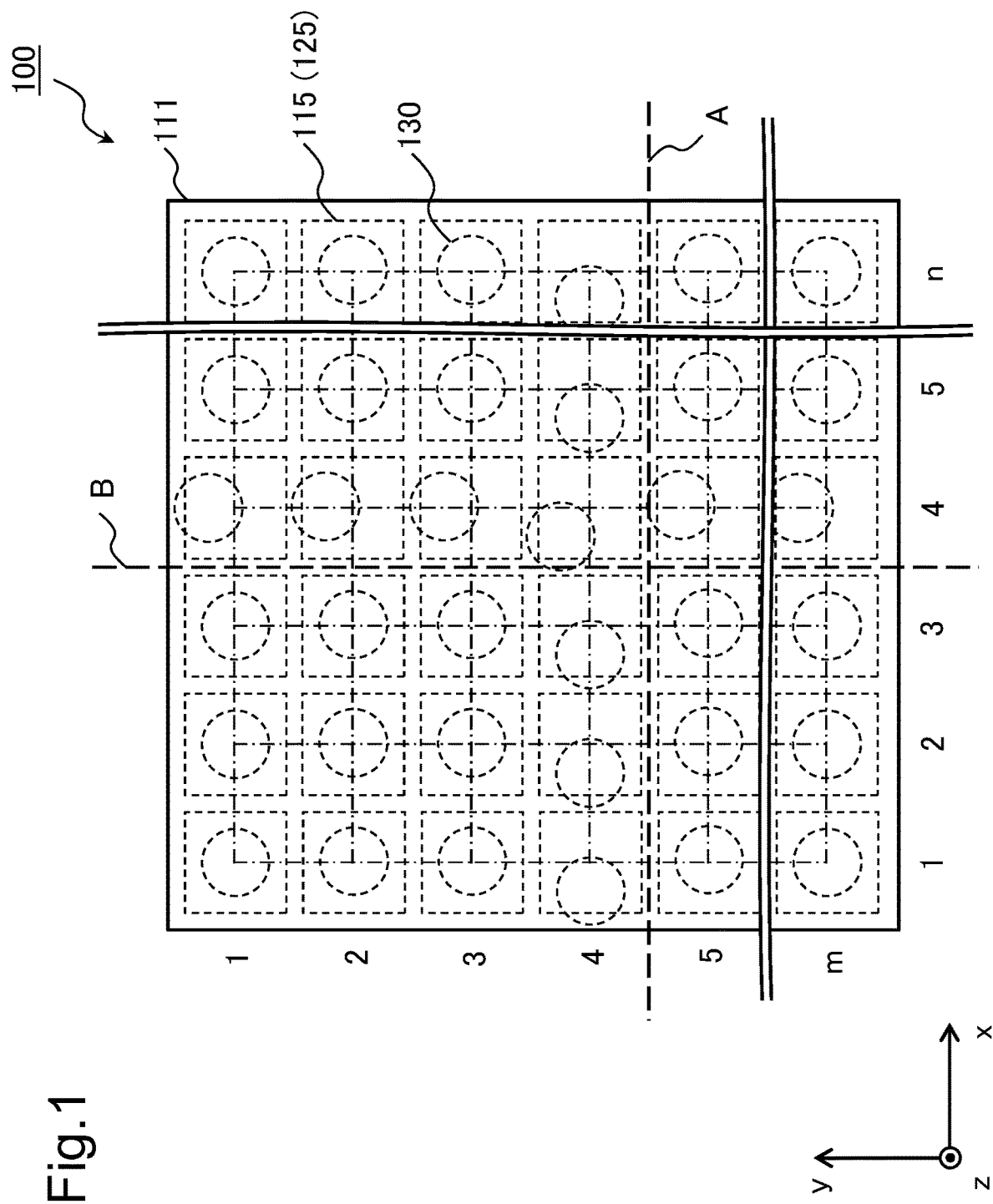
FIG. 1 is a plan view of an example of an infrared sensor according to a first example embodiment.

Example embodiments of the present invention will be described below with reference to the drawings. In the following example embodiments, technically preferable limitations are imposed to carry out the present invention, but the scope of this invention is not limited to the following description. In all drawings used to describe the following example embodiments, the same reference numerals denote similar parts unless otherwise specified. In addition, in the following example embodiments, a repetitive description of similar configurations or arrangements and operations may be omitted.

First Example Embodiment

First, an infrared sensor according to a first example embodiment will be described with reference to the drawings. The present example embodiment assumes an infrared sensor mounted on a quantum infrared camera in which the infrared sensor is cooled when used. The infrared sensor of the present example embodiment can be used not just for a quantum infrared camera but also for any infrared camera.

Figure 2:
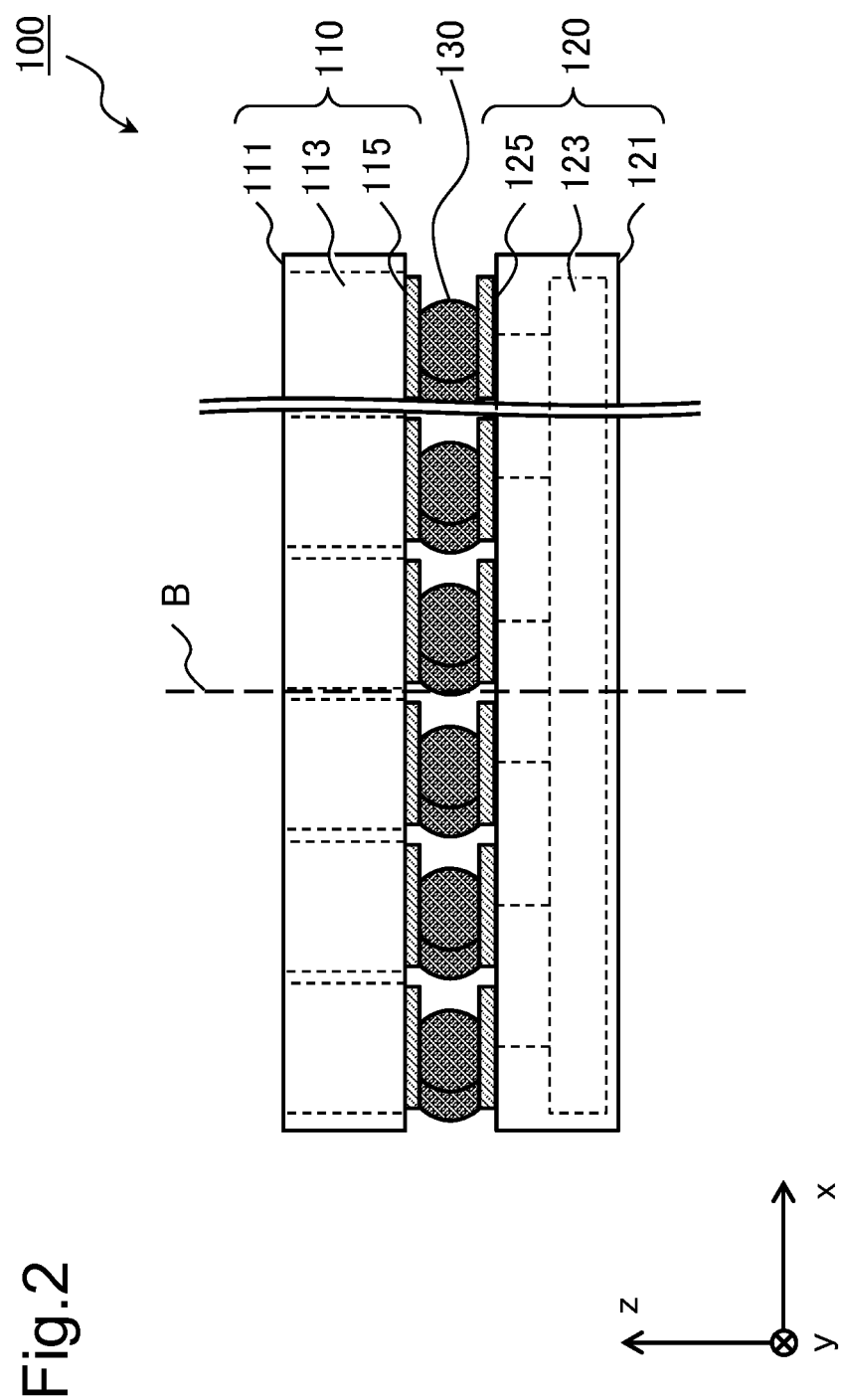
FIG. 2 is a side view of the example of the infrared sensor according to the first example embodiment.
Figure 3:
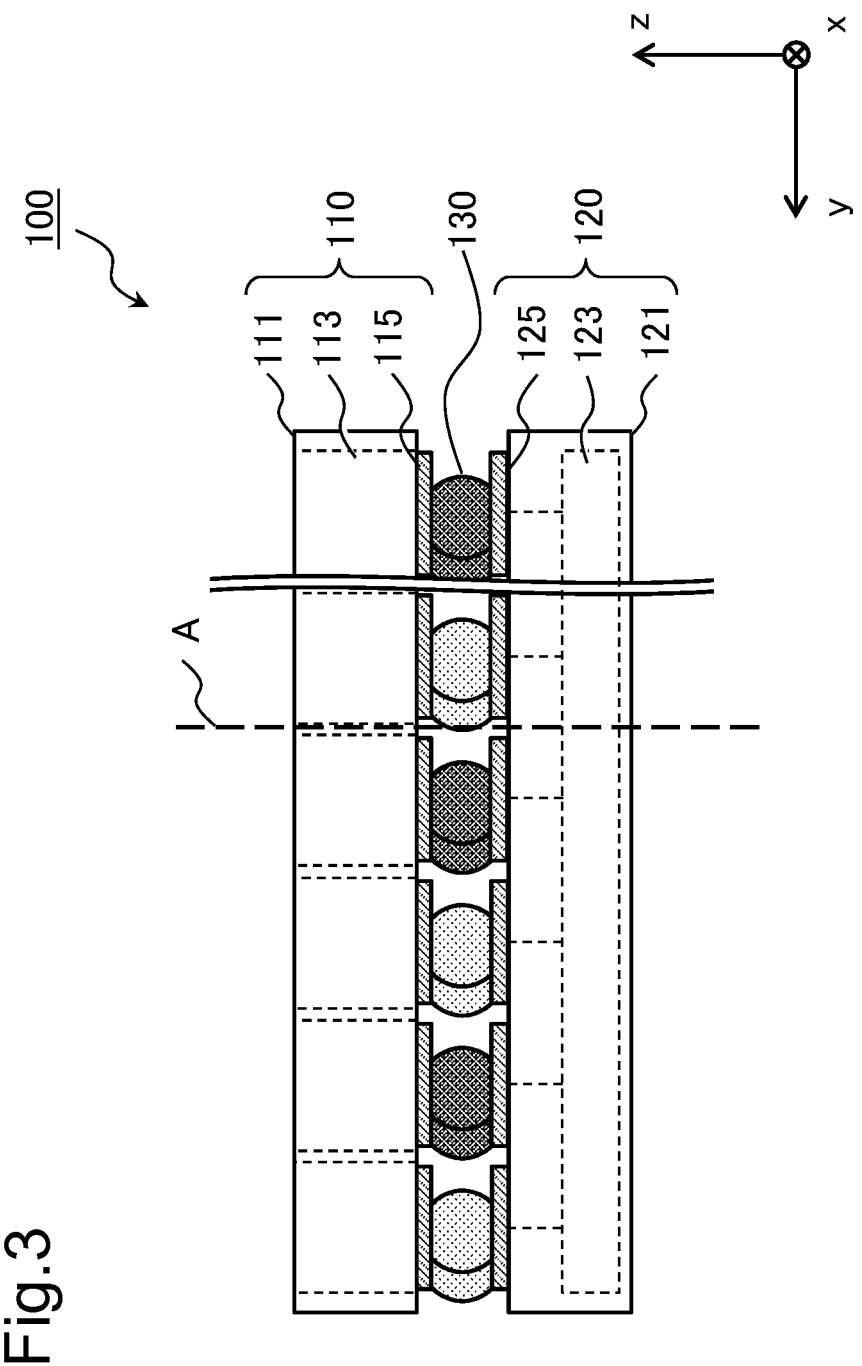
FIG. 3 is another side view of the example of the infrared sensor according to the first example embodiment.
Figure 4:
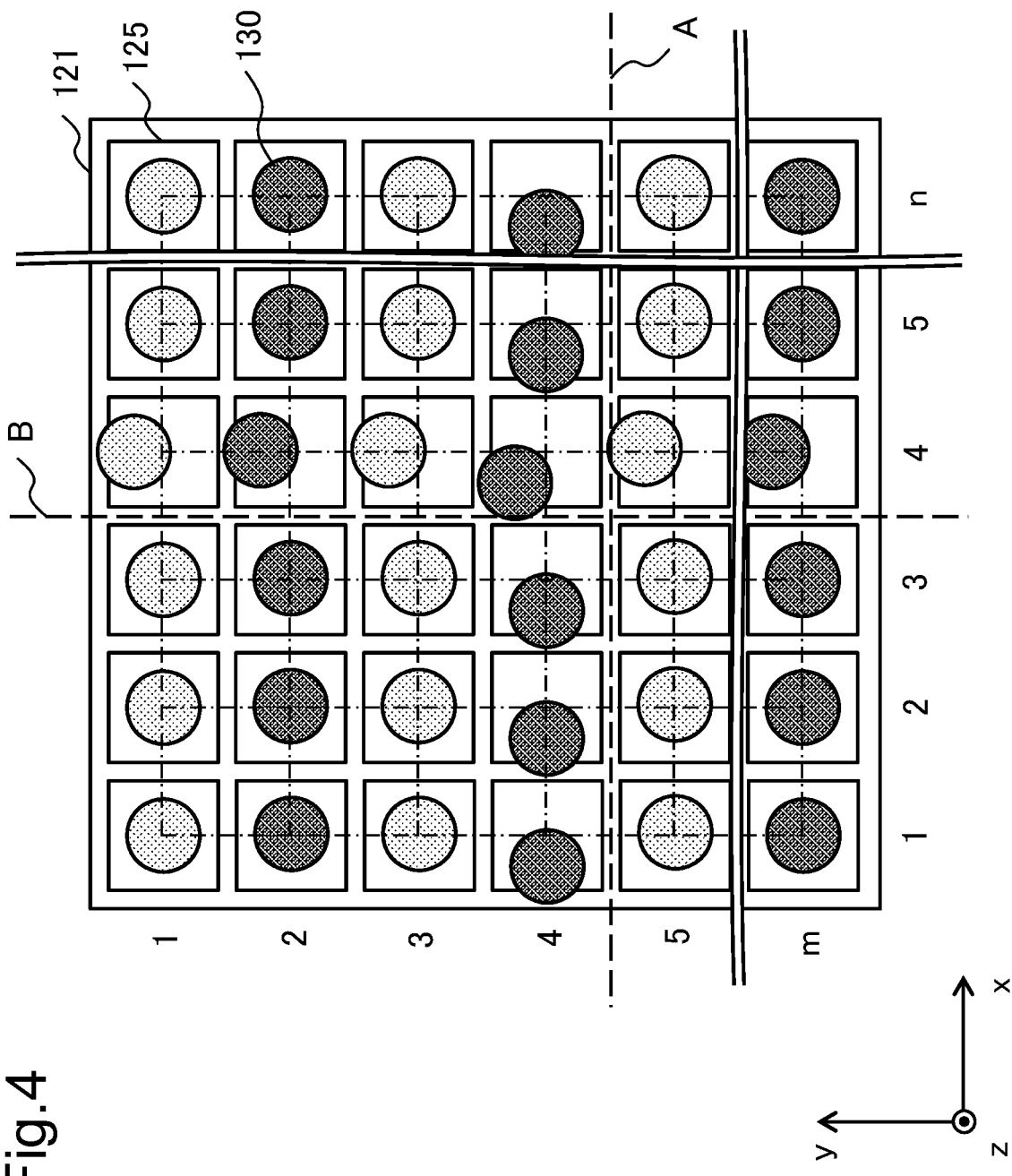
FIG. 4 is a conceptual diagram of the example of the infrared sensor according to the first example embodiment.

FIGS. 1 to 4 are conceptual diagrams for illustrating a structure of an infrared sensor 100 of the present example embodiment. FIG. 1 is a plan view of the infrared sensor 100. FIG. 2 is a side view as viewed from the left side of the infrared sensor 100 in FIG. 1. FIG. 3 is a side view as viewed from the lower side of the infrared sensor 100 in FIG. 1. FIG. 4 is a plan view with a detection substrate 110 described later removed. In FIG. 1, positions of electrodes (first terminals 115) of the detection substrate 110, electrodes (second terminals 125) of a readout substrate 120, and bumps 130, which will be described later, are indicated by broken lines. In FIGS. 2 to 4, for ease of understanding, a plurality of bumps 130 constituting rows adjacent to each other is indicated in different hatches.

The infrared sensor 100 includes the detection substrate 110, the readout substrate 120, and the plurality of bumps 130. The detection substrate 110 has a first substrate 111, a plurality of infrared detection elements 113, and a plurality of first terminals 115. The readout substrate 120 has a second substrate 121, a readout circuit 123, and a plurality of second terminals 125. Each one of the plurality of first terminals 115 is associated with one of the plurality of second terminals 125. Each one of the plurality of first terminals 115 is connected via a bump 130 to the associated second terminal 125. The infrared sensor 100 has a structure in which the detection substrate 110 and the readout substrate 120 are flip-chip bonded by the plurality of bumps 130.

The first substrate 111 is a substrate in which a compound semiconductor such as gallium arsenide (GaAs) is used as a material. On the first substrate 111, the plurality of infrared detection elements 113 is formed in a lattice shape. FIG. 1 illustrates a lattice (long dashed short dashed lines) formed by connecting center positions (also referred to as lattice points) of the plurality of infrared detection elements 113 constituting the infrared sensor 100. The first substrate 111 may be a substrate in which a material other than GaAs is used as long as the infrared detection elements 113 can be formed. For example, the first substrate 111 may be a substrate in which a compound semiconductor such as gallium nitride (GaN) or indium phosphide (InP) is used as a material. The first substrate 111 is flip-chip bonded to the second substrate 121 via the plurality of bumps 130. In order to avoid loss of receiving infrared light, it is desirable that the first substrate 111 be grinded as thinly as possible. Thus, the first substrate 111 has a lower mechanical strength than the second substrate 121.

The plurality of infrared detection elements 113 constitute a plurality of pixels. Each one of the plurality of infrared detection elements 113 converts received infrared light into an electrical signal. The electrical signal converted by each one of the plurality of infrared detection elements 113 is read via a bump 130 to the readout circuit 123 of the readout substrate 120.

Each one of the plurality of first terminals 115 is arranged in association with one of the plurality of infrared detection elements 113. For example, each one of the plurality of first terminals 115 contains, as a main component, conductive metal such as copper (Au) plated with gold (Cu) on surface. Each one of the plurality of first terminals 115 is connected to a bump 130. Each one of the plurality of first terminals 115 is electrically connected via the bump 130 to the associated second terminal 125.

The present example embodiment shows an example in which the plurality of infrared detection elements 113 constitute a lattice of m rows×n columns (m and n are even natural numbers). FIG. 2 illustrates an example in which m and n are even numbers, but m and n may be odd numbers. For example, the plurality of infrared detection elements 113 constitute 256×320 or 480×640 pixels. For example, in a case where an infrared detection element 113 in one pixel is a square of about 30 micrometers, the infrared sensor 100 of 256×320 pixels has a size of about 1 centimeter square. The number of pixels constituted by the plurality of infrared detection elements 113 may be other than 256×320 or 480×640. A grounding electrode is typically arranged on the periphery of the infrared sensor 100. For example, bumps 130 at lattice points on the outermost circumference that are not associated with the infrared detection elements 113 may be arranged to be shifted, and bumps 130 associated with the infrared detection elements 113 may be arranged in a normal manner.

The second substrate 121 is a substrate in which silicon (Si) is used as a material. Thus, the second substrate 121 has a thermal expansion coefficient different from that of the first substrate 111. On the second substrate 121, the readout circuit 123 is formed. The second substrate 121 may be a substrate in which a material other than Si is used as long as the readout circuit 123 can be formed.

The readout circuit 123 is a circuit for detecting infrared light received by each one of the plurality of infrared detection elements 113 formed on the detection substrate 110. For example, the readout circuit 123 is constituted by a complementary metal oxide semiconductor (CMOS) circuit formed on a silicon wafer. The readout circuit 123 reads an electrical signal from each one of the plurality of infrared detection elements 113. The electrical signal read from each one of the plurality of infrared detection elements 113 by the readout circuit 123 is converted into image data.

Each one of the plurality of second terminals 125 is arranged in association with one of the plurality of first terminals 115. For example, each one of the plurality of second terminals 125 contains, as a main component, conductive metal such as copper (Au) plated with gold (Cu) on surface. Each one of the plurality of second terminals 125 is connected to a bump 130. Each one of the plurality of second terminals 125 is electrically connected via the bump 130 to the associated first terminal 115.

Each one of the plurality of bumps 130 is arranged in association with one of the plurality of infrared detection elements 113. Each one of the plurality of bumps 130 electrically connects, on a one-to-one basis, one of the first terminals 115 associated with one of the plurality of infrared detection elements 113 and one of the second terminals 125 associated with the first terminal 115. It is desirable that the plurality of bumps 130 be uniform in shape and size. The shapes and sizes of the plurality of bumps 130 typically include manufacturing errors. The plurality of bumps 130 may differ in shape and size to an extent that does not pose any problem in mechanical/electrical connection.

For example, the arrangement of the bumps 130 can be determined by grinding the infrared sensor 100 to expose the bumps 130 or by examining the infrared sensor 100 with an X-ray camera.

The bumps 130 contain, as a main component, a low-melting-point metal such as indium (In). The bumps 130 may contain an additive other than In. The material of the bumps 130 is not limited to In as long as the detection substrate 110 and the readout substrate 120 can be flip-chip bonded. In a case where the bumps 130 contain, as a main component, soft metal such as In, the bumps 130 deform, and this relaxes stress due to a difference in thermal expansion coefficient between the first substrate 111 and the second substrate 121. For example, the bumps 130 are formed on surfaces of the first terminals 115 or the second terminals 125 by plating or electron gun deposition via a mask having an open arrangement pattern. The bumps 130, which have a cylindrical shape when formed on the surfaces of the first terminals 115 or the second terminals 125, are formed into a spherical shape by melting by wetback.

When the detection substrate 110 and the readout substrate 120 are flip-chip bonded, gaps are formed between the plurality of bumps 130. The bumps 130 may be formed on the surfaces of the second terminals 125 of the readout substrate 120. Alternatively, the bumps 130 may be formed by melting and integrating a bump formed on the surface of each of the first terminals 115 of the detection substrate 110 and a bump formed on the surface of each of the second terminals 125 of the readout substrate 120.

The gaps formed by the plurality of bumps 130 are typically filled with a thermosetting resin as an underfill. In order to facilitate a flow of the underfill, a void space having a horizontal to vertical ratio of 1:1 is formed between adjacent bumps 130 when viewed from a side surface direction. For example, the underfill is poured into the void space between the plurality of bumps 130 in a vacuum state. In the present example embodiment, the underfill is not illustrated for the sake of simplicity.

Bumps 130 forming at least one row and column among the plurality of bumps 130 are arranged with their centers shifted from lattice points of a lattice formed by the plurality of infrared detection elements 113. The bumps 130 whose centers are arranged to be shifted from the lattice points are arranged to avoid contact with adjacent bumps 130 when the width is maximized in a top view during a manufacturing process. The bumps 130 whose centers are arranged to be shifted from the lattice points are arranged so that ends are positioned in gaps between the adjacent first terminals 115 and second terminals 125. The bumps 130 whose centers are arranged to be shifted from the lattice points are arranged at positions where the bumps 130 are not in electrical contact with first terminals 115, second terminals 125, and bumps 130 that are associated with adjacent lattice points.

For example, the bumps 130 are arranged to be shifted from the centers of the pixels within a range from equal to or more than 10% to equal to or less than 50% of the pitch size of the pixels of the infrared detection elements 113. In a case where the shift from the center of the pixel is less than 10%, the effect of relaxing the stress applied to the gaps between the bumps 130 is small. In a case where the shift from the center of the pixel exceeds 50%, forming wiring inside the first substrate 111 or the second substrate 121 turn to be difficult. In a case where the shift from the center of the pixel exceeds 50%, adjacent bumps 130 easily come into contact with each other.

In the case of the example in FIG. 1, bumps 130 in the fourth row and the fourth column are arranged with their centers shifted from the lattice points. The bumps 130 in the fourth row and the fourth column have one end positioned in a gap between adjacent first terminals 115 (second terminals 125). When the plurality of bumps 130 are arranged as illustrated in FIG. 1, one of the bumps 130 has an end positioned on a line of a gap between any of the electrodes (first terminals 115/second terminals 125) associated with the plurality of infrared detection elements 113 in all rows and columns. For example, the bump 130 in the fifth row and the fourth column is positioned on line A in a gap between electrodes in the fourth row and electrodes in the fifth row. For example, the bump 130 in the fourth row of the fourth column is positioned on line B in a gap between electrodes in the third column and electrodes in the fourth column.

In the first substrate 111, the positions of the gaps between the plurality of first terminals 115 have a lower mechanical strength than the positions where the first terminals 115 reinforced by the bumps 130 are formed. Thus, in a case where nothing is positioned in the gaps between the plurality of the first terminals 115, stress caused by warpage generated when the infrared sensor 100 is cooled may be directly applied to the gaps, and a crack in a straight line may be generated in some cases. In a case where at least one of the bumps 130 is positioned on a line in a gap between a plurality of electrodes, stress caused by warpage generated when the infrared sensor 100 is cooled is relaxed by the bump 130 arranged in the gap. As a result, the first substrate 111 is less likely to deform in the row direction and the column direction of the lattice constituted by the plurality of infrared detection elements 113. Thus, the stress applied to the gap between the plurality of electrodes is relaxed, and warpage and cracks are less likely to be generated in the detection substrate 110 having a relatively lower strength than the readout substrate 120.

(Related Art)

Figure 5:
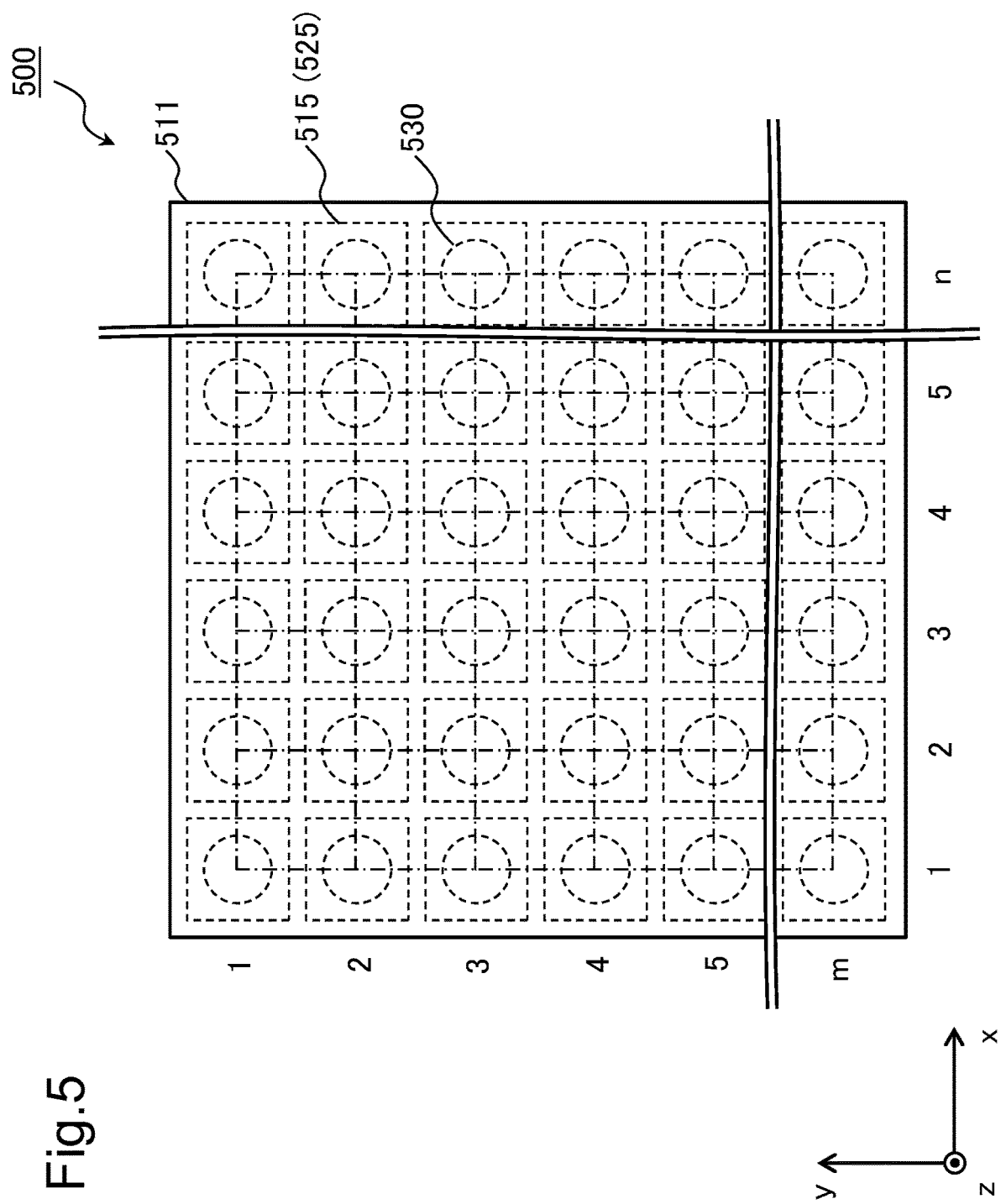
FIG. 5 is a plan view of an example of an infrared sensor according to a related art.
Figure 6:
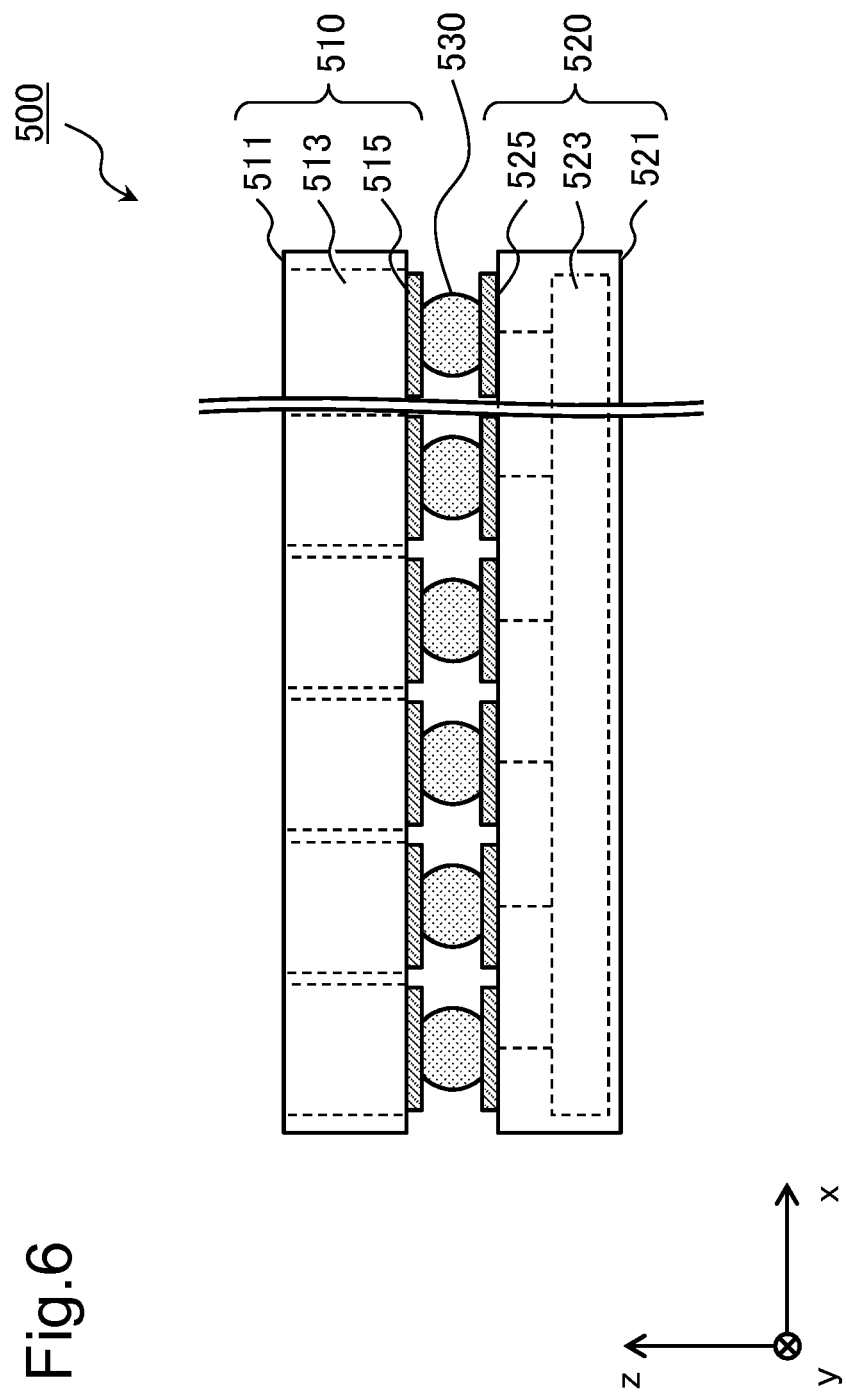
FIG. 6 is a side view of the example of the infrared sensor according to the related art.

Next, an infrared sensor of a related art will be described with an example. In the infrared sensor of the related art, a plurality of bumps are arranged at positions of lattice points of a lattice formed by a plurality of infrared detection elements 513. FIGS. 5 and 6 are conceptual diagrams for illustrating an example of an infrared sensor 500 of the related art. FIG. 5 is a plan view of the infrared sensor 500. FIG. 6 is a side view as viewed from the lower side of the infrared sensor 500 in FIG. 5.

The infrared sensor 500 includes a detection substrate 510, a readout substrate 520, and a plurality of bumps 530. The detection substrate 510 has a first substrate 511, the plurality of infrared detection elements 513, and a plurality of first terminals 515. The readout substrate 520 has a second substrate 521, a readout circuit 523, and a plurality of second terminals 525. Each one of the plurality of first terminals 515 is associated with one of the plurality of second terminals 525. Each one of the plurality of first terminals 515 is connected via a bump 530 to the associated second terminal 525. The infrared sensor 500 has a structure in which the detection substrate 510 and the readout substrate 520 are flip-chip bonded by the plurality of bumps 530.

In the first substrate 511, the positions of the gaps between the plurality of first terminals 515 have a lower mechanical strength than the positions where the first terminals 515 are formed. Thus, stress caused by warpage generated when the infrared sensor 500 is cooled is directly applied to the positions of the gaps between the plurality of first terminals 515. As a result, due to the stress applied to the gaps between the plurality of electrodes, warpage and cracks are likely to be generated in the detection substrate 510 having a relatively lower strength than the readout substrate 520.

First Modification

Figure 7:
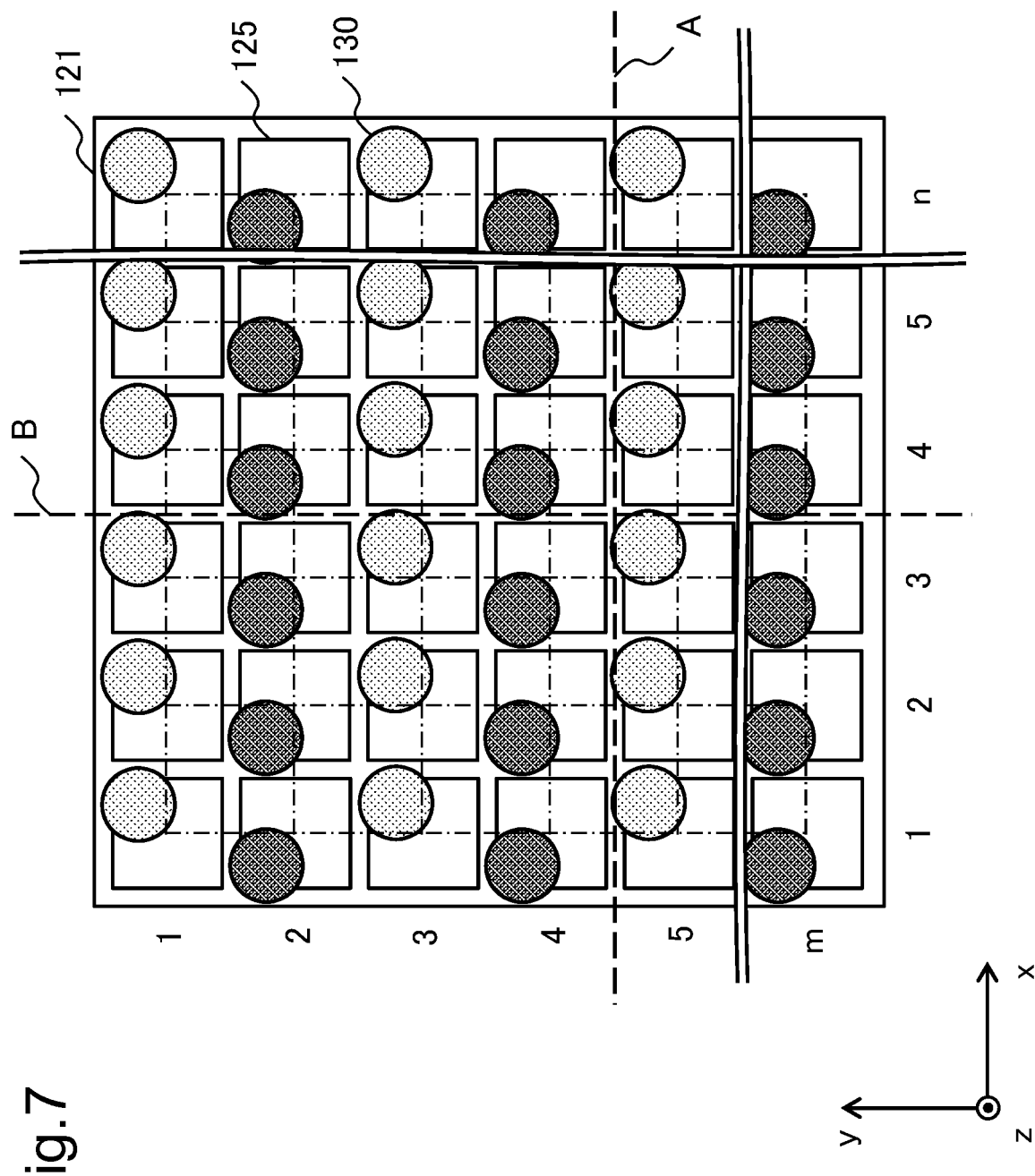
FIG. 7 is a conceptual diagram of an example of an infrared sensor according to a first modification.
Figure 8:
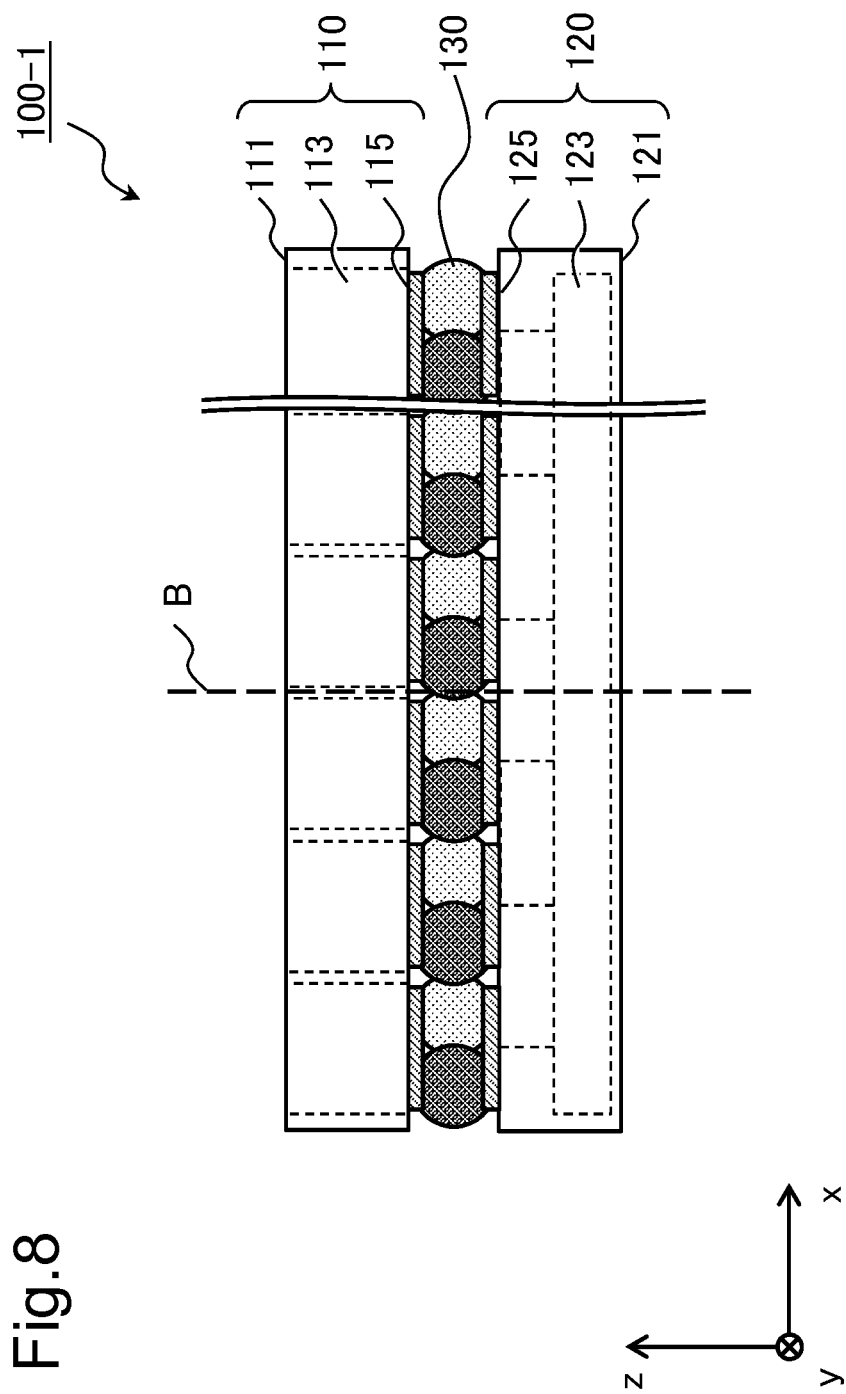
FIG. 8 is a side view of the example of the infrared sensor according to the first modification.

Next, an infrared sensor of a first modification will be described with an example. The infrared sensor of the present modification is an example in which every one of the plurality of bumps 130 is arranged to be shifted. FIGS. 7 and 8 are conceptual diagrams for illustrating an example of an infrared sensor 100-1 of the present modification. FIG. 7 is a plan view with the detection substrate 110 removed. FIG. 8 is a side view as viewed from the lower side of the infrared sensor 100-1 in FIG. 7.

In the present modification, the bumps 130 in odd-numbered rows are shifted to the upper right of electrodes (second terminals 125), and the bumps 130 in even-numbered rows are shifted to the upper left of electrodes (second terminals 125). The present modification is an example, and the direction, position, and the like in which the bumps 130 are shifted are not particularly limited. In the present modification, the bumps 130 are shifted with regularity, but the bumps 130 may be shifted at random.

In the present modification, pluralities of bumps 130 belonging to adjacent rows and columns are shifted in opposite directions from each other. Thus, in the case of the plurality of bumps 130 of the infrared sensor 100-1 of the present modification, the bumps 130 are positioned in all gaps between the electrodes. For example, all the bumps 130 in the fifth row are positioned on line A in a gap between electrodes in the fourth row and electrodes in the fifth row. For example, all the bumps 130 in the third and fourth columns are positioned on line B in a gap between electrodes in the third column and electrodes in the fourth column. As compared with the infrared sensor 100 in FIGS. 1 to 4, the infrared sensor 100-1 of the present modification has more bumps 130 positioned in the gaps between the electrodes. Thus, according to the infrared sensor 100-1 of the present modification, deformation in the row direction and the column direction of the infrared sensor 100-1 is less likely to occur than the infrared sensor 100 in FIGS. 1 to 4.

Second Modification

Figure 9:
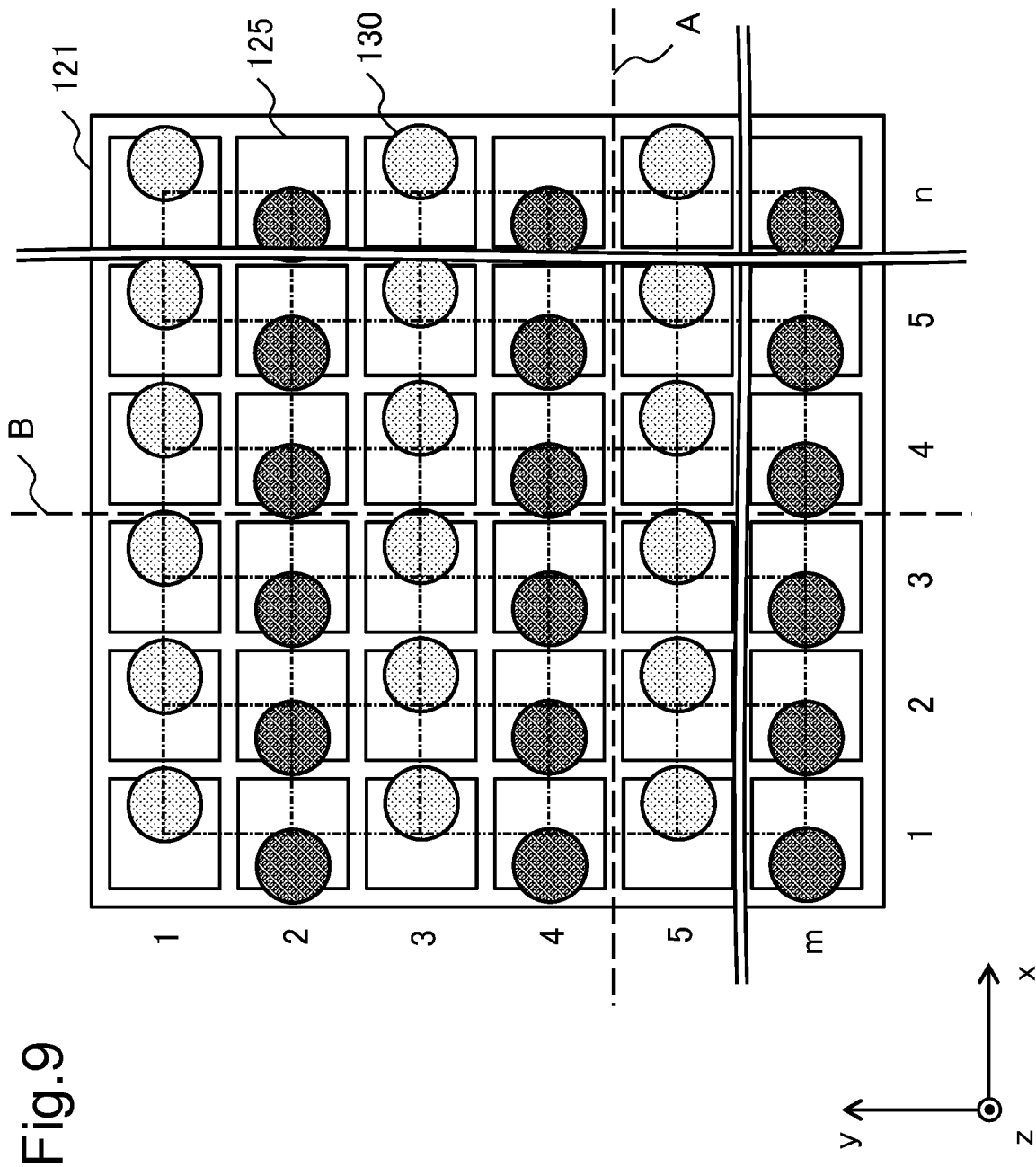
FIG. 9 is a conceptual diagram of an example of an infrared sensor according to a second modification.

Next, an infrared sensor of a second modification will be described with an example. The infrared sensor of the present modification is an example in which every one of the plurality of bumps 130 is arranged to be shifted in the row direction. FIG. 9 is a conceptual diagram for illustrating an example of the infrared sensor of the present modification. FIG. 9 is a plan view with the detection substrate 110 removed.

In the present modification, the bumps 130 in odd-numbered rows are shifted to the right (+x) of electrodes (second terminals 125), and the bumps 130 in even-numbered rows are shifted to the left (−x) of electrodes (second terminals 125). The present modification is an example, and the direction, position, and the like in which the bumps 130 are shifted are not particularly limited.

In the present modification, pluralities of bumps 130 belonging to adjacent rows are shifted in opposite directions from each other in the row direction (x direction). Thus, in the infrared sensor of the present modification, the bumps 130 are positioned in all gaps between the electrodes adjacent in the row direction (x direction). For example, there is no bump 130 on line A in a gap between electrodes in the fourth row and electrodes in the fifth row. On the other hand, for example, some of the bumps 130 in the third and fourth columns are positioned on line B in a gap between electrodes in the third column and electrodes in the fourth column. As compared with the infrared sensor 100-1 of the first modification, the infrared sensor of the present modification has fewer bumps 130 positioned in the gaps between the electrodes. For example, in an infrared detection element such as a line sensor having a large ratio of length in the longitudinal direction (also referred to as the first direction) to length in the lateral direction (also referred to as the second direction), warpage in the longitudinal direction is likely to be generated. Thus, in a case where there is a difference between the length in the longitudinal direction and the length in the lateral direction, relatively large stress is likely to be applied in the lateral direction, and a crack in the lateral direction is likely to be generated. In such a case, some of the bumps 130 may be positioned in the gaps between the electrodes arranged in the longitudinal direction, so that warpage in the longitudinal direction is less likely to be generated.

Third Modification

Figure 10:
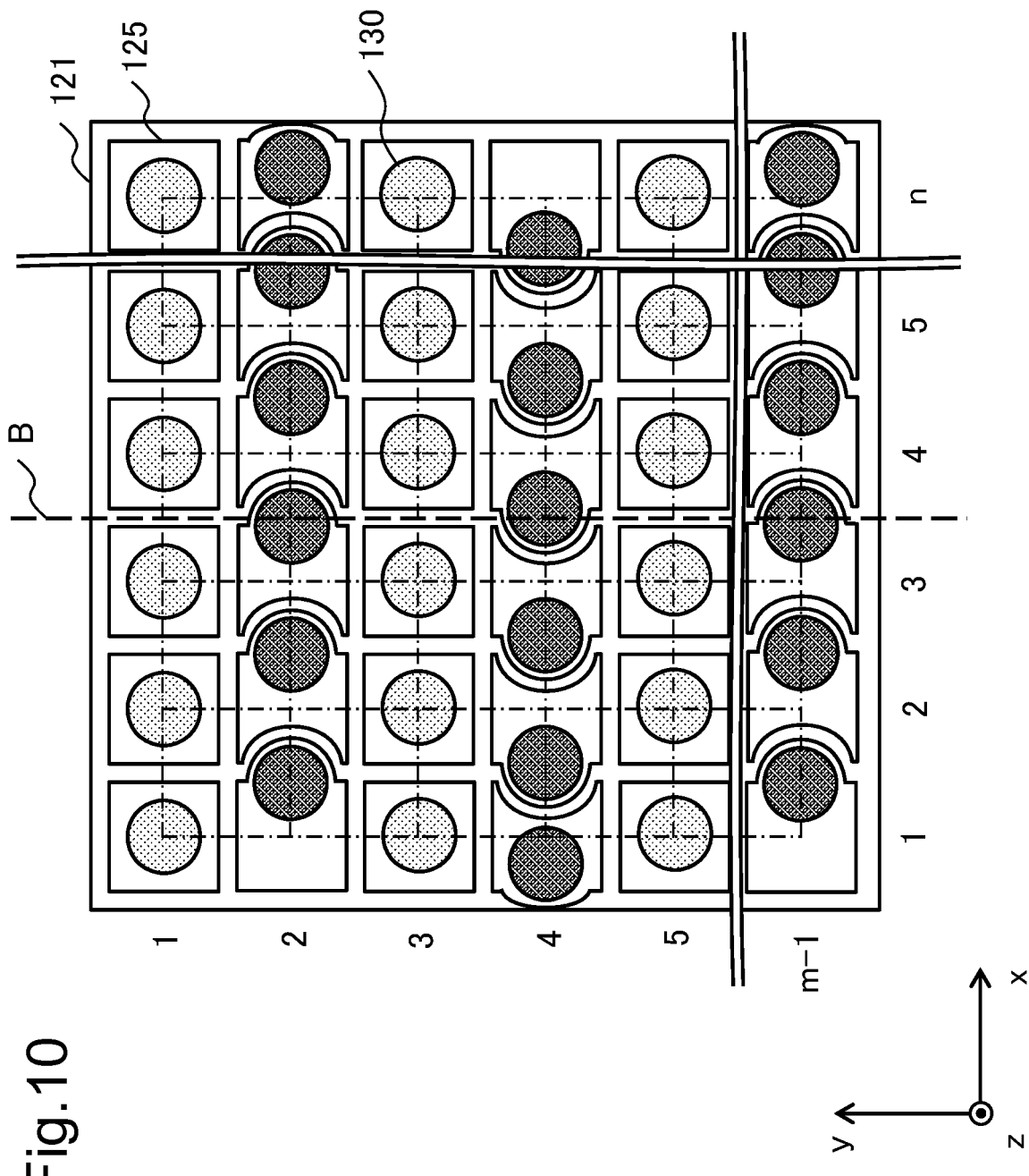
FIG. 10 is a conceptual diagram of an example of an infrared sensor according to a third modification.

Next, an infrared sensor of a third modification will be described with an example. The infrared sensor of the present modification is an example in which shapes of at least some of electrodes (first terminals 115 and second terminals 125) are deformed. FIG. 10 is a conceptual diagram for illustrating an example of the infrared sensor of the present modification. FIG. 10 is a plan view with the detection substrate 110 removed. In the following description, it is assumed that first terminals 115 associated with deformed second terminals 125 are also deformed in a similar manner to the associated second terminals 125.

In the present modification, second terminals 125 in even-numbered rows are deformed so that bumps 130 in even-numbered rows are arranged to be largely shifted to the right (+x) or to the left (−x). In the example in FIG. 10, the right side of each second terminal 125 in the second row is deformed into a shape with a protruding semicircle. The left side of each second terminal 125 in the second row of the second to n-th columns is deformed into a chipped shape to avoid the semicircle protruding from the second terminal 125 on the immediate left. The left side of each second terminal 125 in the fourth row is deformed into a shape with a protruding semicircle. The right side of each second terminal 125 in the fourth row of the first to (n−1)th columns is deformed into a chipped shape to avoid the semicircle protruding from the second terminal 125 on the immediate right. The bumps 130 are arranged on the protruding semicircles. The present modification is an example, and the shapes of the second terminals 125, the positions where the bumps 130 are arranged, and the like are not particularly limited. The second terminals 125 in not just even-numbered rows but also odd-numbered rows may be deformed. The second terminals 125 may be deformed not just in the row direction but also in the column direction.

In the present modification, electrodes are deformed so that some of the electrodes are positioned on lines in gaps between electrodes. Then, bumps are arranged on the electrodes positioned on the lines of the gaps between the electrodes. Thus, in the case of the plurality of bumps 130 of the infrared sensor of the present modification, electrodes and bumps 130 are positioned in a gap between electrodes. For example, the second terminals 125 and the bumps 130 in the second row of the third column, the fourth row of the fourth column, and the n-th row of the third column are positioned on line B in a gap between electrodes in the third column and electrodes in the fourth column. As compared with the first and second modifications, in the present modification, deformation along a gap between electrodes is less likely to occur because electrodes and bumps are positioned in the gaps between the electrodes.

As described above, the infrared sensor of the present example embodiment includes a detection substrate, a readout substrate, and a plurality of bumps. The detection substrate includes a first substrate in which a plurality of infrared detection elements are arranged in a lattice shape and a plurality of first terminals each of which is associated with one of the infrared detection elements are arranged. The readout substrate includes a second substrate in which a plurality of second terminals each of which is associated with one of the plurality of first terminals is arranged and a readout circuit that reads an electrical signal based on infrared light detected by each one of the plurality of infrared detection elements is formed. The plurality of bumps electrically connects each one of the plurality of first terminals to one of the plurality of second terminals associated with the one of the plurality of first terminals. At least one of the plurality of first terminals, the plurality of second terminals, or the plurality of bumps is partially arranged at a position between the infrared detection elements that are adjacent in a top view.

In the present example embodiment, at least one of the plurality of bumps is partially arranged at a position between the infrared detection elements that are adjacent in a top view. Thus, according to the present example embodiment, warpage of a substrate on which infrared detection elements are formed can be reduced.

In an aspect of the present example embodiment, at least one of the plurality of bumps is partially arranged at a position in a gap formed between the plurality of first terminals and the plurality of second terminals. For example, at least one of the plurality of bumps is arranged to be shifted from the centers of the plurality of infrared detection elements within a range from equal to or more than 10% to equal to or less than 50% of a pitch size of the plurality of infrared detection elements. For example, the first substrate and the second substrate are rectangular, and at least one of the plurality of bumps is arranged to be shifted in the longitudinal direction of the first substrate and the second substrate. For example, every one of the plurality of bumps is arranged at a position in a gap formed between the plurality of first terminals and the plurality of second terminals. For example, the plurality of first terminals and the plurality of second terminals are deformed in accordance with shifts of the plurality of bumps.

According to this aspect, deformation in the row direction and the column direction of the lattice constituted by the plurality of infrared detection elements is less likely to occur. Thus, the stress applied to the gaps between the plurality of electrodes is relaxed, and warpage and cracks are less likely to be generated in the detection substrate having a relatively lower strength than the readout substrate.

A quantum infrared detector is typically used at liquid helium temperature (4.2 Kelvin) or liquid nitrogen temperature (77 Kelvin). Thus, when the quantum infrared detector is used, warpage is generated in a chip constituting the infrared sensor due to a difference in thermal expansion coefficient between the substrates that have been flip-chip bonded. In a case where warpage occurs in the chip, the detection substrate having a relatively low strength becomes susceptible to cracking. Cracks of the detection substrate (also referred to as chip cracking) lead to reduced operability of the quantum infrared detector. For example, when infrared light detected by a plurality of infrared detection elements arranged in a lattice shape is imaged, variations in sensitivity of the elements and bad pixels are corrected. When chip cracking has occurred, a streak caused by the chip cracking appears in an image. It is not possible to completely remove the streak caused by the chip cracking by the correction, and the streak causes the image to lack sharpness.

In the present example embodiment, the arrangement of the plurality of bumps is intentionally shifted from a regular lattice shape so that there is no area where the mechanical strength is low in a linear manner to cross the chip, and the mechanical strength of the whole chip is increased. As a result, chip cracking can be avoided, and the operability is improved.

For example, a GaAs substrate used as the detection substrate is susceptible to cracking in a plane orientation. The GaAs substrate is susceptible to cracking in a direction parallel or perpendicular to a straight notch (also referred to as an orientation flat) indicating the direction of a crystal axis (plane orientation). For example, in a case where a plurality of bumps are arranged in an oblique direction with respect to the crystal axis as in the related art, it is possible to make the substrate less susceptible to cracking in a direction of a matrix of pixels. However, even in such a case, the substrate is still susceptible to cracking along the crystal axis. According to the present example embodiment, even in such a case, chip cracking can be avoided.

Second Example Embodiment

Next, an infrared sensor according to a second example embodiment will be described with reference to the drawings. The infrared sensor of the present example embodiment differs from the first example embodiment in that electrodes associated a plurality of infrared detection elements are shifted from the centers (lattice points) of the plurality of infrared detection elements.

Figure 11:
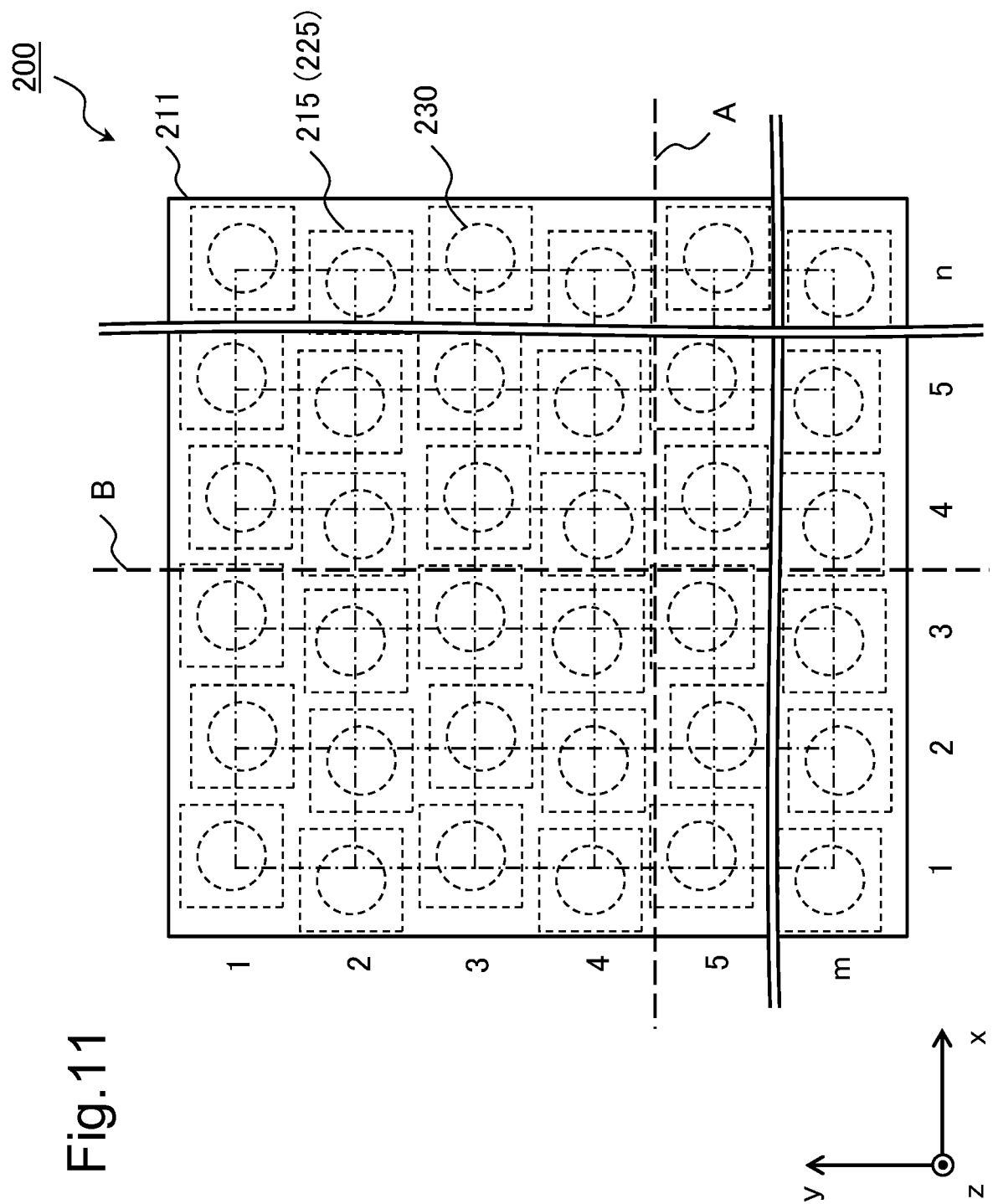
FIG. 11 is a plan view of an example of an infrared sensor according to a second example embodiment.
Figure 12:
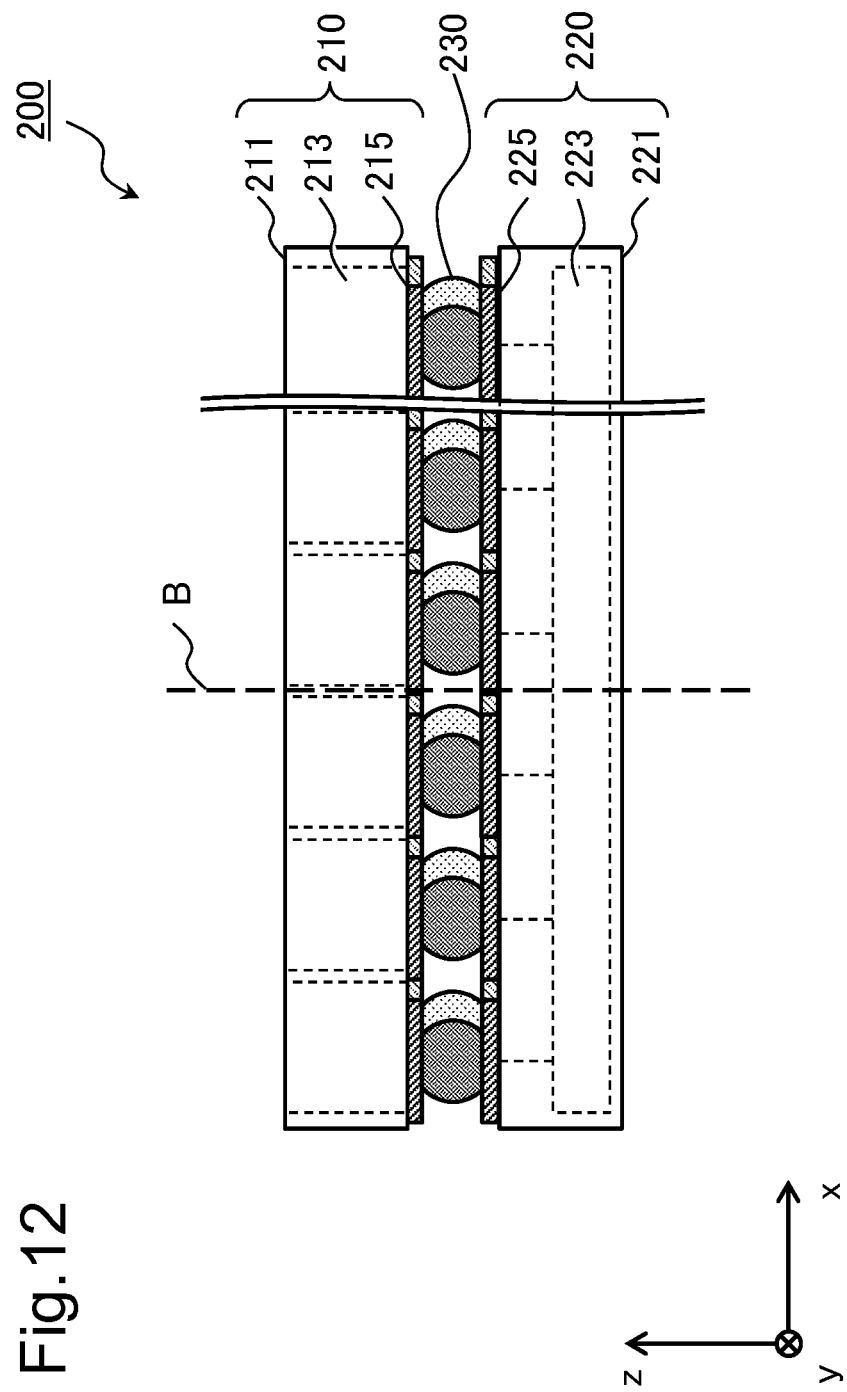
FIG. 12 is a side view of the example of the infrared sensor according to the second example embodiment.
Figure 13:
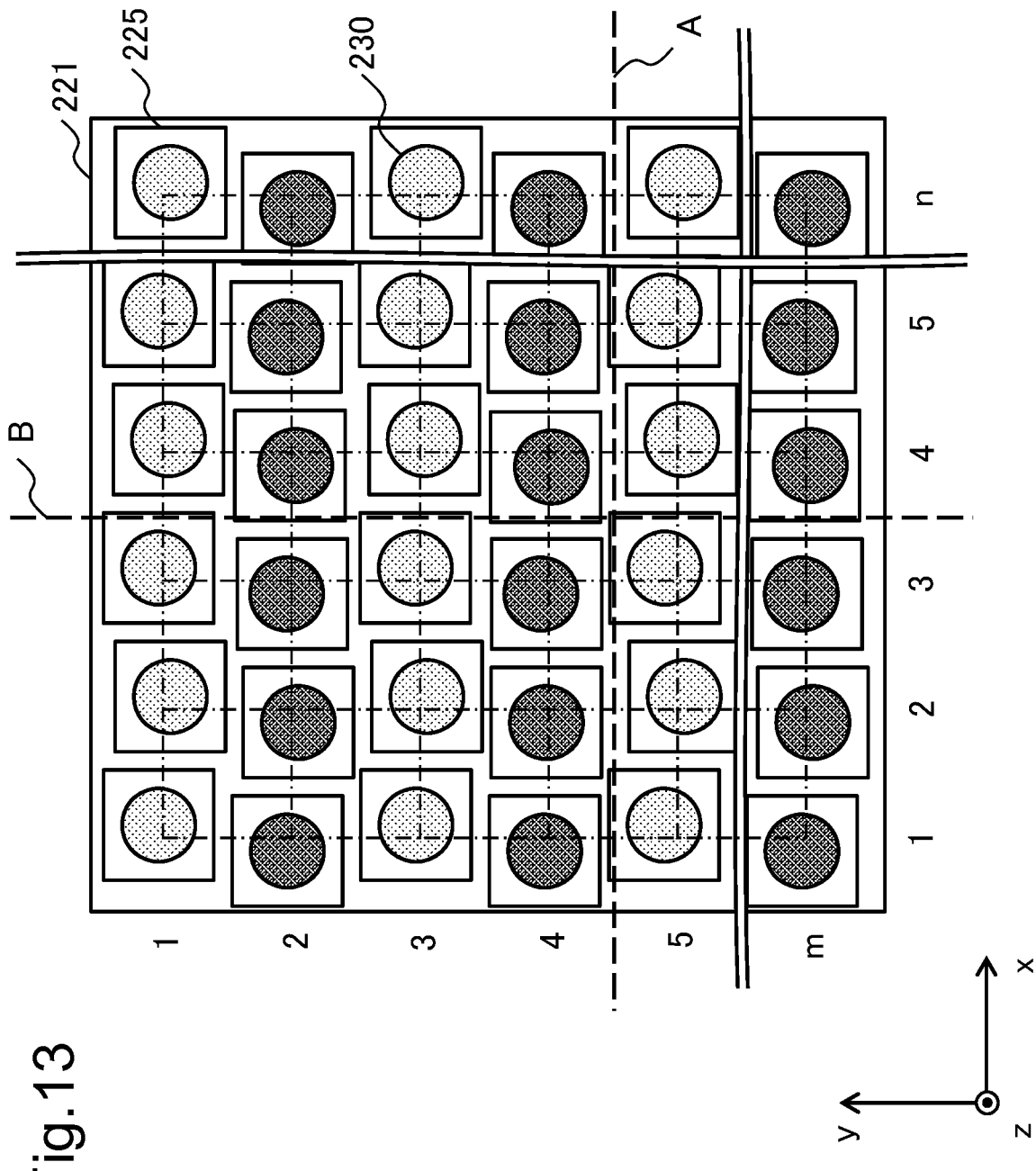
FIG. 13 is a conceptual diagram of the example of the infrared sensor according to the second example embodiment.

FIGS. 11 to 13 are conceptual diagrams for illustrating a structure of an infrared sensor 200 of the present example embodiment. FIG. 11 is a plan view of the infrared sensor 200. FIG. 12 is a side view as viewed from the lower side of the infrared sensor 200 in FIG. 11. FIG. 13 is a plan view with a detection substrate 210 described later removed. In FIG. 11, positions of electrodes (first terminals 215) of the detection substrate 210, electrodes (second terminals 225) of a readout substrate 220, and bumps 230, which will be described later, are indicated by broken lines. In FIGS. 12 and 13, for ease of understanding, a plurality of bumps 230 constituting rows adjacent to each other is indicated in different hatches.

The infrared sensor 200 includes the detection substrate 210, the readout substrate 220, and the plurality of bumps 230. The detection substrate 210 has a first substrate 211, a plurality of infrared detection elements 213, and a plurality of first terminals 215. The readout substrate 220 has a second substrate 221, a readout circuit 223, and a plurality of second terminals 225. Each one of the plurality of first terminals 215 is associated with one of the plurality of second terminals 225. Each one of the plurality of first terminals 215 is connected via a bump 230 to the associated second terminal 225. The infrared sensor 200 has a structure in which the detection substrate 210 and the readout substrate 220 are flip-chip bonded by the plurality of bumps 230. The infrared sensor 200 is similar to the infrared sensor 100 of the first example embodiment except for the arrangement of the first substrate 211, the second substrate 221, and the bumps 130. Thus, in the following description, portions similar to those of the infrared sensor 100 will not be described. In the following description, the arrangement of the electrodes (first terminals 215 and second terminals 225) will be described mainly with reference to FIG. 13 (second terminals 225).

At least one of the plurality of second terminals 225 is arranged to be shifted from directly below the plurality of infrared detection elements 213 to be positioned on a line between the plurality of infrared detection elements 213 in a top view. The second terminal 225 arranged to be shifted is arranged at a position where the second terminal 225 is not in electrical contact with adjacent second terminals 225. For example, the arrangement of the second terminals 225 can be changed by changing a mask used for forming the second terminals 225 on the surfaces of the second substrate 221, and it is not necessary to add a new process in manufacturing. The arrangement of the first terminals 215 can also be changed by changing a mask in a similar manner to the second terminals 225.

In the case of the example in FIG. 13, the second terminals 225 in the fifth row of the first column, the fifth row of the third column, and the fifth row of the fifth column are partially positioned on line A between the infrared detection elements 213 in the fourth row and the infrared detection elements 213 in the fifth row. The second terminals 225 in the first row of the third column, the second row of the fourth column, the third row of the third column, the fourth row of the fourth column, the fifth row of the third column, and the m-th row of the fourth column are partially positioned on line B between the infrared detection elements 213 in the third column and the infrared detection elements 213 in the fourth column.

In the infrared sensor 200, at least one of the electrodes (first terminals 215 and second terminals 225) is positioned between the plurality of infrared detection elements 213 in all rows and columns in a top view. Thus, in the infrared sensor 200, the mechanical strength between the plurality of infrared detection elements 213 is higher than that in a case where a plurality of electrodes is neatly arranged in a lattice shape directly below the plurality of infrared detection elements 213. As a result, the first substrate 211 is less likely to deform in the row direction and the column direction of the lattice constituted by the plurality of infrared detection elements 213. Thus, the stress applied between the plurality of infrared detection elements 213 is relaxed, and warpage and cracks are less likely to be generated in the detection substrate 210 having a relatively lower strength than the readout substrate 220.

Fourth Modification

Figure 14:
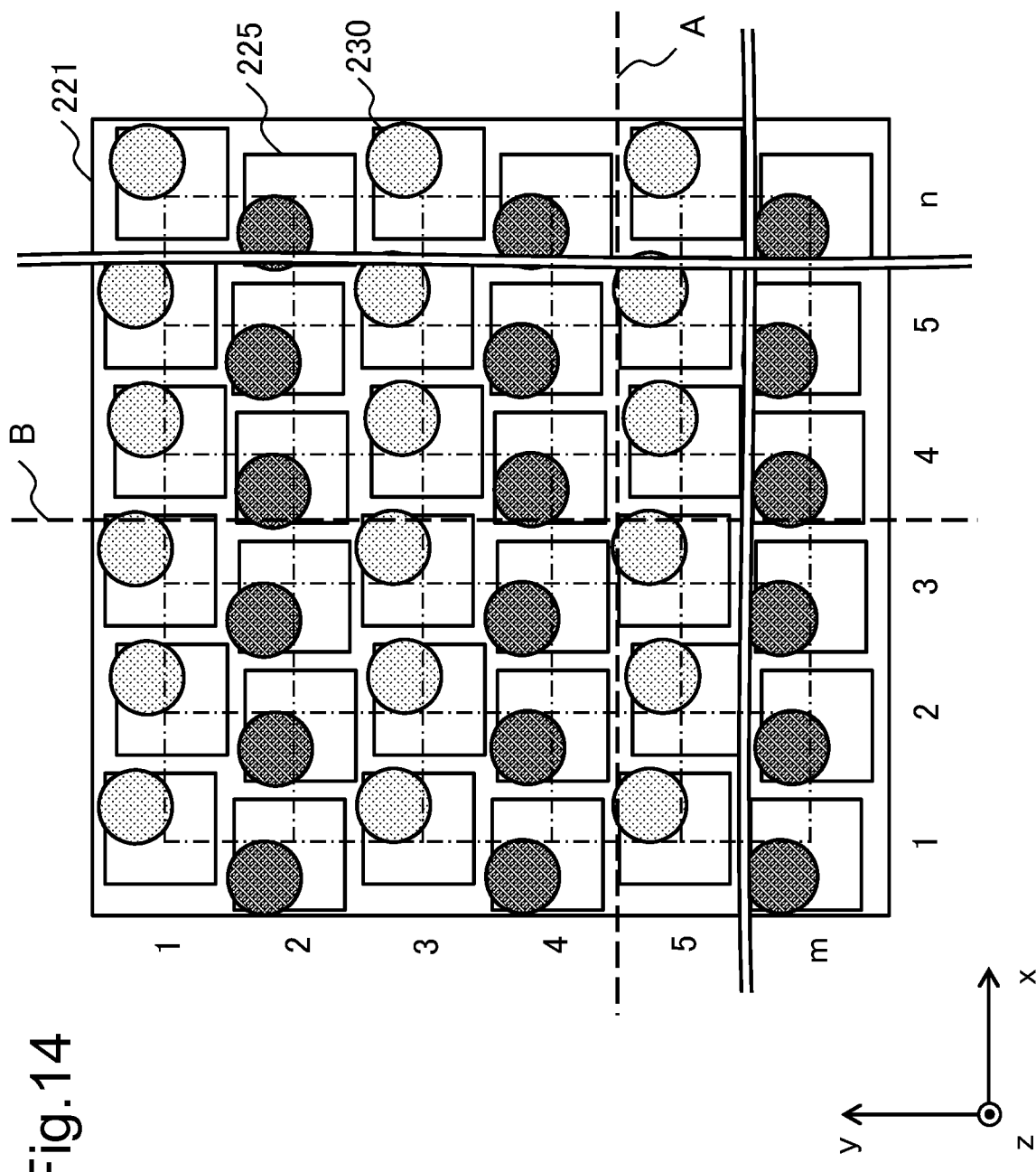
FIG. 14 is a conceptual diagram of an example of an infrared sensor according to a fourth modification.
Figure 15:
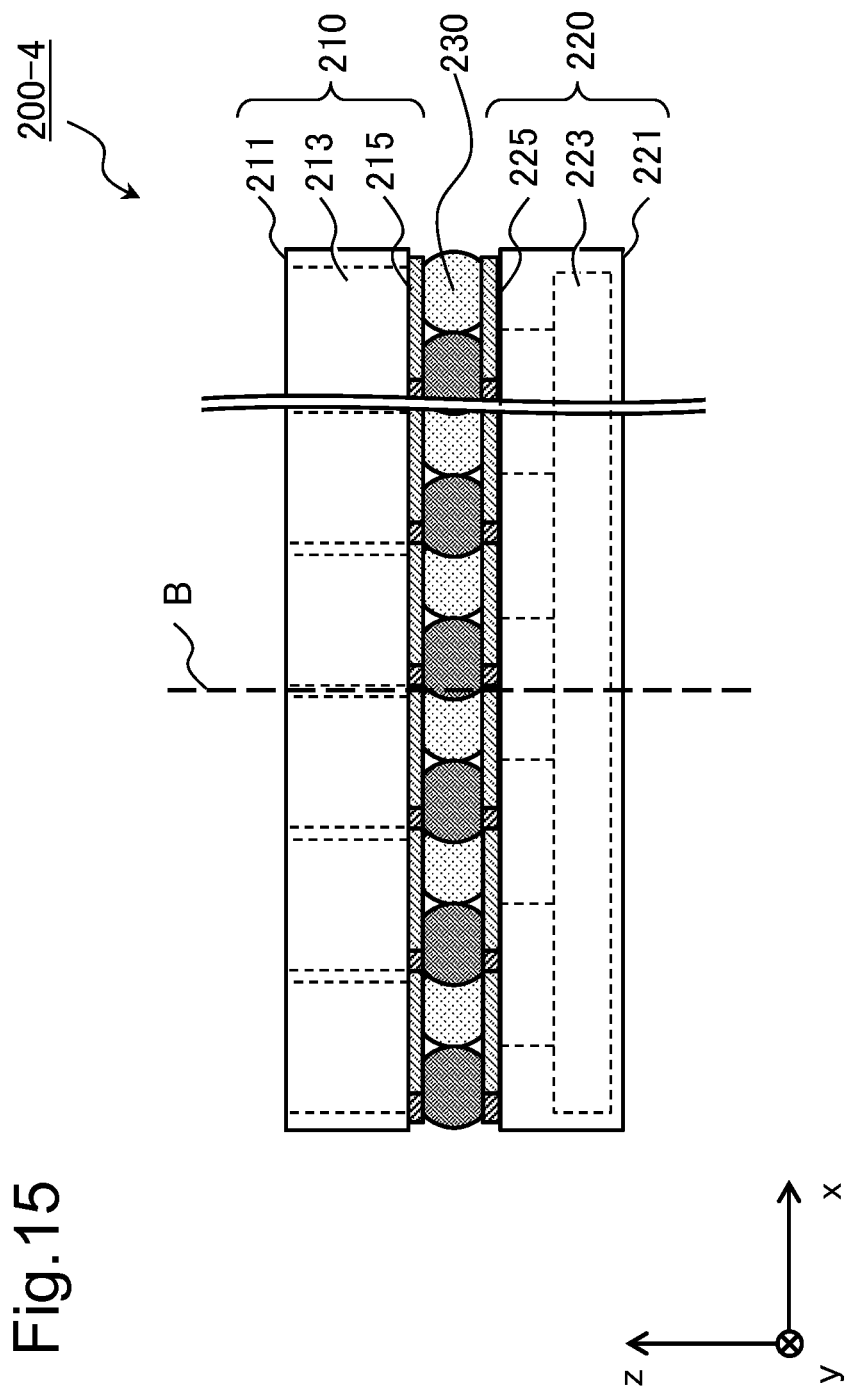
FIG. 15 is a side view of the example of the infrared sensor according to the fourth modification.

Next, an infrared sensor of a fourth modification will be described with an example. The infrared sensor of the present modification is an example in which, in addition to a plurality of electrodes (first terminals 215 and second terminals 225), the plurality of bumps 230 are arranged to be shifted. FIGS. 14 and 15 are conceptual diagrams for illustrating an example of an infrared sensor 200-4 of the present modification. FIG. 14 is a plan view with the detection substrate 210 removed. FIG. 15 is a side view as viewed from the lower side of the infrared sensor 200-4 in FIG. 14.

In the present modification, the bumps 230 in odd-numbered rows are shifted to the upper right of electrodes (second terminals 225), and the bumps 230 in even-numbered rows are shifted to the upper left of electrodes (second terminals 225). The present modification is an example, and the direction, position, and the like in which the bumps 230 are shifted are not particularly limited. In the present modification, the bumps 230 are shifted with regularity, but the bumps 230 may be shifted at random.

In the present modification, pluralities of bumps 230 belonging to adjacent rows and columns are shifted in opposite directions from each other in the row direction. Thus, in the case of the plurality of bumps 230 of the infrared sensor 200-4 of the present modification, the bumps 230 are positioned on lines between the plurality of infrared detection elements 213. For example, the bumps 230 in the fifth row of the first column, the fifth row of the third column, and the fifth row of the fifth column are positioned on line A between the infrared detection elements 213 in the fourth row and the infrared detection elements 213 in the fifth row. For example, the bumps 230 in the first row of the third column, the second row of the fourth column, the third row of the third column, the fourth row of the fourth column, the fifth row of the third column, and the m-th row of the fourth column are positioned on line B between the infrared detection elements 213 in the third column and the infrared detection elements 213 in the fourth column. As described above, in the infrared sensor 200-4 of the present modification, the bumps 230 are positioned on the lines between the plurality of infrared detection elements 213 in a top view. Thus, as compared with the infrared sensor 200 in FIGS. 11 to 13, the infrared sensor 200-4 of the present modification is less likely to deform in the row direction and the column direction.

Fifth Modification

Figure 16:
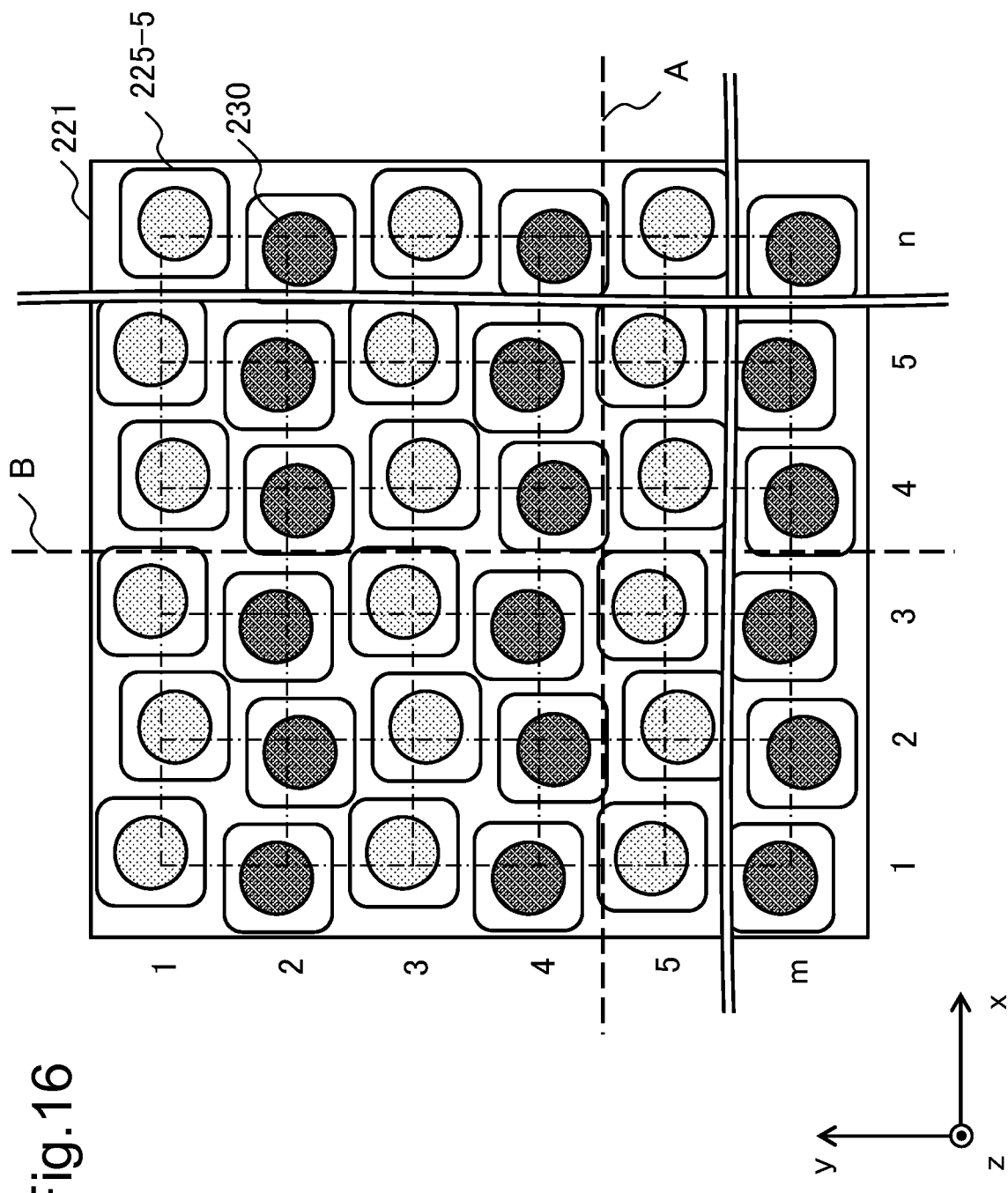
FIG. 16 is a conceptual diagram of an example of an infrared sensor according to a fifth modification.

Next, an infrared sensor of a fifth modification will be described with an example. The infrared sensor of the present modification is an example in which shapes of a plurality of electrodes (first terminals 215 and second terminals 225) are deformed. FIG. 16 is a conceptual diagram for illustrating an example of the infrared sensor of the present modification. FIG. 16 is a plan view with the detection substrate 210 removed. The infrared sensor of the present modification has components similar to those of the infrared sensor 200 of the second example embodiment, and some of the components are not illustrated, and are designated by the same reference numerals.

In the present modification, at least one of a plurality of second terminals 225-5 with rounded corners is arranged to be shifted from directly below the plurality of infrared detection elements 213 to be positioned on a line between the plurality of infrared detection elements 213 in a top view. Although not illustrated, the corners of a plurality of first terminals arranged on the first substrate 211 are also rounded in a similar manner to the second terminals 225-5. The shape of the corners of the second terminals 225-5 is not limited as long as the shape is deformed to avoid electrical contact with other adjacent second terminals 225-5.

In the infrared sensor of the present modification, the electrodes (first terminals 215 and second terminals 225) can be shifted more largely than the infrared sensor 200 of the second example embodiment due to the rounded corners. For example, in the infrared sensor 200 of the second example embodiment, the bumps 230 in the second, fourth, and n-th columns have not been able to be positioned on line A between the infrared detection elements 213 in the fourth row and the infrared detection elements 213 in the fifth row in a top view. On the other hand, in the infrared sensor of the present modification, the bumps 230 in the fifth row of the first column, the fourth row of the second column, the fifth row of the third column, the fourth row of the fourth column, the fifth row of the fifth column, and the fourth row of the n-th column are positioned on line A between the infrared detection elements 213 in the fourth row and the infrared detection elements 213 in the fifth row in a top view. As described above, in the infrared sensor of the present modification, the electrodes can be shifted more largely than in the second example embodiment. Thus, as compared with the infrared sensor 200 of the second example embodiment, the infrared sensor of the present modification is less likely to deform in the row direction and the column direction.

Sixth Modification

Figure 17:
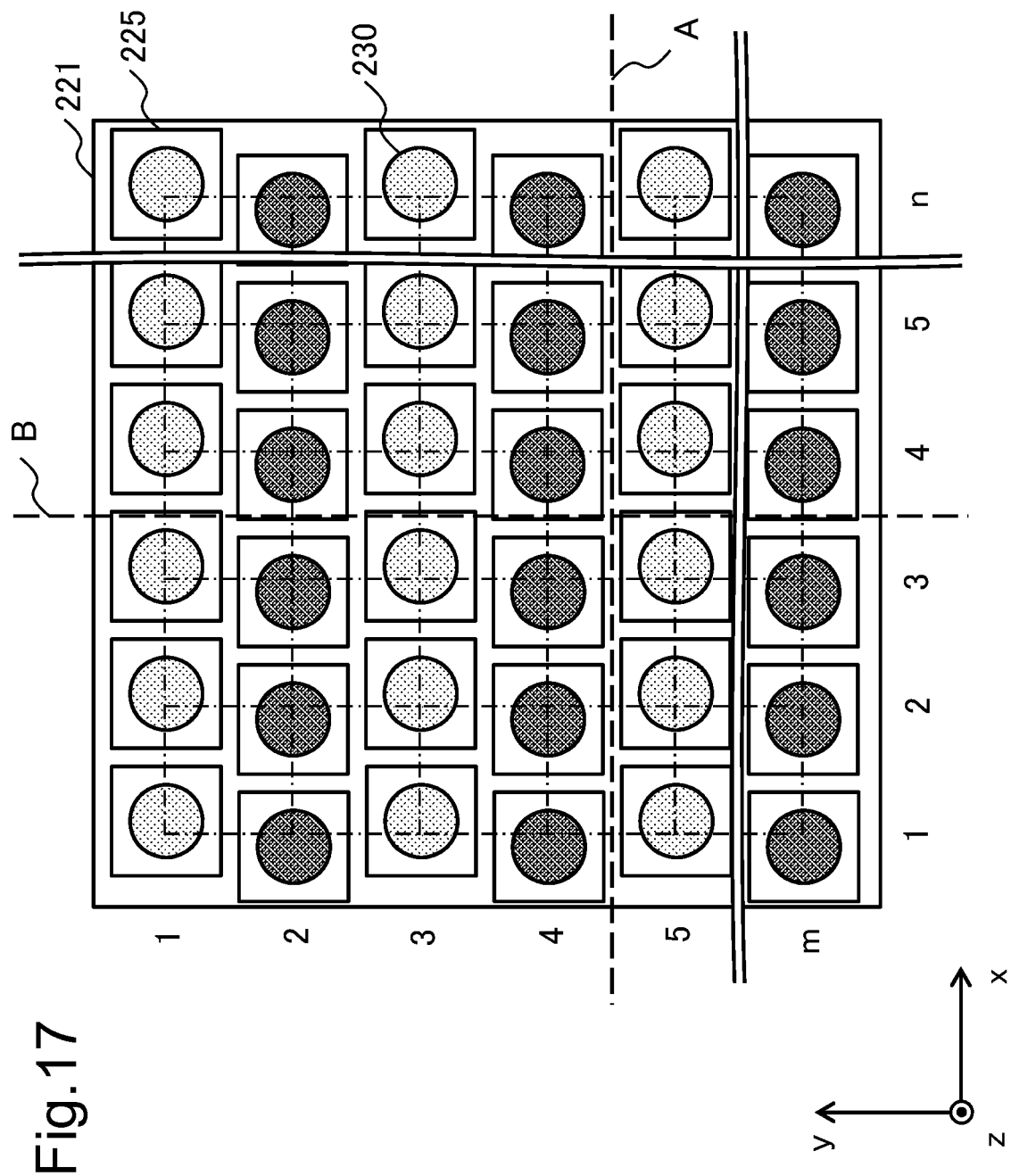
FIG. 17 is a conceptual diagram of an example of an infrared sensor according to a sixth modification.

Next, an infrared sensor of a sixth modification will be described with an example. The infrared sensor of the present modification is an example in which every one of a plurality of electrodes (first terminals 215 and second terminals 225) are arranged to be shifted in the row direction. FIG. 17 is a conceptual diagram for illustrating an example of the infrared sensor of the present modification. FIG. 17 is a plan view with the detection substrate 210 removed. The infrared sensor of the present modification has components similar to those of the infrared sensor 200 of the second example embodiment, and some of the components are not illustrated, and are designated by the same reference numerals.

In the present modification, electrodes (second terminals 225) in odd-numbered rows are shifted to the right (+x), and electrodes (second terminals 225) in even-numbered rows are shifted to the left (−x). The present modification is an example, and the direction, position, and the like in which the electrodes (second terminals 225) are shifted are not particularly limited. Although not illustrated, the first terminals 215 are also shifted to associate to the second terminals 225.

In the present modification, pluralities of electrodes belonging to adjacent rows are shifted in opposite directions from each other in the row direction (x direction). Thus, in the infrared sensor of the present modification, the electrodes are positioned between every adjacent infrared detection elements 213 in the row direction (x direction). For example, in a top view, no electrode is positioned on line A between the infrared detection elements 213 in the fourth row and the infrared detection elements 213 in the fifth row. On the other hand, for example, one of the electrodes in the third and fourth columns is positioned on line B between electrodes in the third column and electrodes in the fourth column in a top view. As compared with the infrared sensor 200 of the second example embodiment, the infrared sensor of the present modification has fewer electrodes positioned between the plurality of infrared detection elements 213 in a top view. For example, in an infrared detection element such as a line sensor having a large ratio of length in the longitudinal direction (also referred to as the first direction) to length in the lateral direction (also referred to as the second direction), warpage in the longitudinal direction is likely to be generated. Thus, in a case where there is a difference between the length in the longitudinal direction and the length in the lateral direction, relatively large stress is likely to be applied in the lateral direction, and a crack in the lateral direction is likely to be generated. In such a case, electrodes may be positioned between the infrared detection elements 213 arranged in the longitudinal direction in a top view, so that warpage in the longitudinal direction is less likely to be generated.

As described above, the infrared sensor of the present example embodiment includes a detection substrate, a readout substrate, and a plurality of bumps. The detection substrate includes a first substrate in which a plurality of infrared detection elements are arranged in a lattice shape and a plurality of first terminals each of which is associated with one of the infrared detection elements is arranged. The readout substrate includes a second substrate in which a plurality of second terminals each of which is associated with one of the plurality of first terminals are arranged and a readout circuit that reads an electrical signal based on infrared light detected by each one of the plurality of infrared detection elements is formed. The plurality of bumps electrically connects each one of the plurality of first terminals to one of the plurality of second terminals associated with the one of the plurality of first terminals. At least one of the plurality of first terminals, the plurality of second terminals, or the plurality of bumps is partially arranged at a position between the infrared detection elements that are adjacent in a top view.

In the present example embodiment, at least one of the plurality of first terminals or the plurality of second terminals is partially arranged at a position between the infrared detection elements that are adjacent in a top view. Thus, according to the present example embodiment, warpage of a substrate on which infrared detection elements are formed can be reduced.

In an aspect of the present example embodiment, at least one of sets of a plurality of first terminals and a plurality of second terminals associated with each other is arranged at a position between the infrared detection elements that are adjacent in a top view. For example, corners of the plurality of first terminals and the plurality of second terminals are deformed to avoid electrical contact with the plurality of first terminals and the plurality of second terminals that are adjacent to the corners. For example, the first substrate and the second substrate are rectangular, and at least one of sets of the plurality of first terminals and the plurality of second terminals associated with each other is arranged to be shifted in the longitudinal direction of the first substrate and the second substrate.

According to this aspect, the first substrate is less likely to deform in at least one of the row direction or the column direction of the lattice constituted by the plurality of infrared detection elements. Thus, the stress applied between the plurality of infrared detection elements is relaxed, and warpage and cracks are less likely to be generated in the detection substrate having a relatively lower strength than the readout substrate.

Third Example Embodiment

Figure 18:
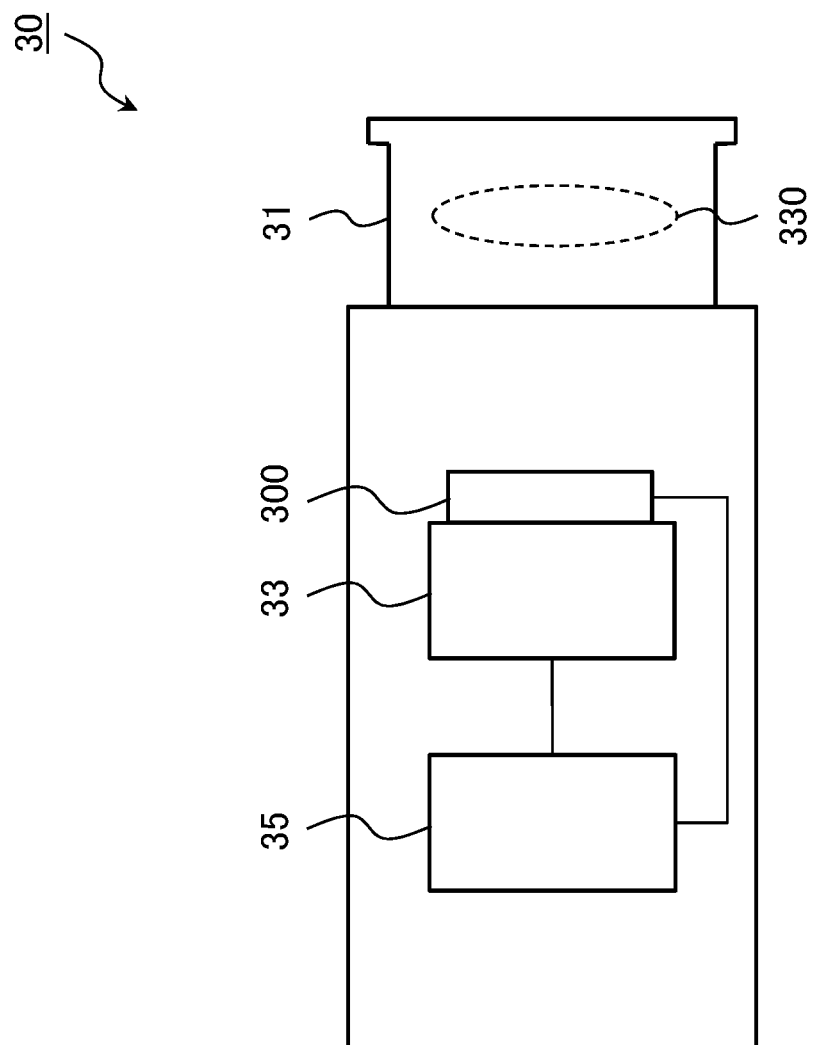
FIG. 18 is a conceptual diagram illustrating an example of an imaging apparatus according to a third example embodiment.

Next, an imaging apparatus according to a third example embodiment will be described with reference to the drawings. The imaging apparatus of the present example embodiment includes the infrared sensor of the first or second example embodiment. FIG. 18 is a conceptual diagram illustrating an example of a configuration of an imaging apparatus 30 of the present example embodiment. The imaging apparatus 30 includes an infrared sensor 300, a lens 31, a cooler 33, and a controller 35.

The infrared sensor 300 has a configuration similar to that of the infrared sensor 100 of the first example embodiment and the infrared sensor 200 of the second example embodiment. The infrared sensor 300 outputs, under control of the controller 35, an electrical signal based on received infrared light to the controller 35. The electrical signal output to the controller 35 is converted into image data associated to light received by a plurality of infrared detection elements included in the infrared sensor 300. For example, the infrared sensor 300 is vacuum sealed by a sealing member having a window through which infrared light passes. For example, a material similar to that of the lens 31 described later may be used for the window provided in the sealing member.

The lens 31 includes a lens 330 capable of converging infrared light in a wavelength band to be detected. The lens 31 converges infrared light in the wavelength band to be detected on a light receiving surface of the infrared sensor 300. For example, the lens 31 may include the lens 330 in which a material such as germanium (Ge), silicon (Si), zinc sulfide (ZnS), zinc selenide (ZnSe), or sapphire (Al2O3) is used. For example, the lens 31 may include the lens 330 in which a material such as barium fluoride (BaF2), calcium fluoride (CaF2), lithium fluoride (LiF), or chalcogenide glass is used. The lens 31 may include the lens 330 capable of converging infrared light in the wavelength band to be detected. For example, the lens 31 has an autofocus function and focuses on the light receiving surface of the infrared sensor 300 under control of the controller 35.

The cooler 33 cools the infrared sensor 300. In FIG. 18, the infrared sensor 300 and the cooler 33 are in contact with each other. In a quantum infrared sensor, the cooler 33 is necessary in order to eliminate an influence of noise due to a dark current or the like. For example, the cooler 33 cools the infrared sensor 300 to be within a temperature range of about 60 to 250 Kelvin. For example, a cooler having a Stirling mechanism or an electronic cooling element utilizing Peltier effect is used for the cooler 33. For example, the cooler 33 cools the infrared sensor 300 to an appropriate temperature under control of the controller 35.

Figure 19:
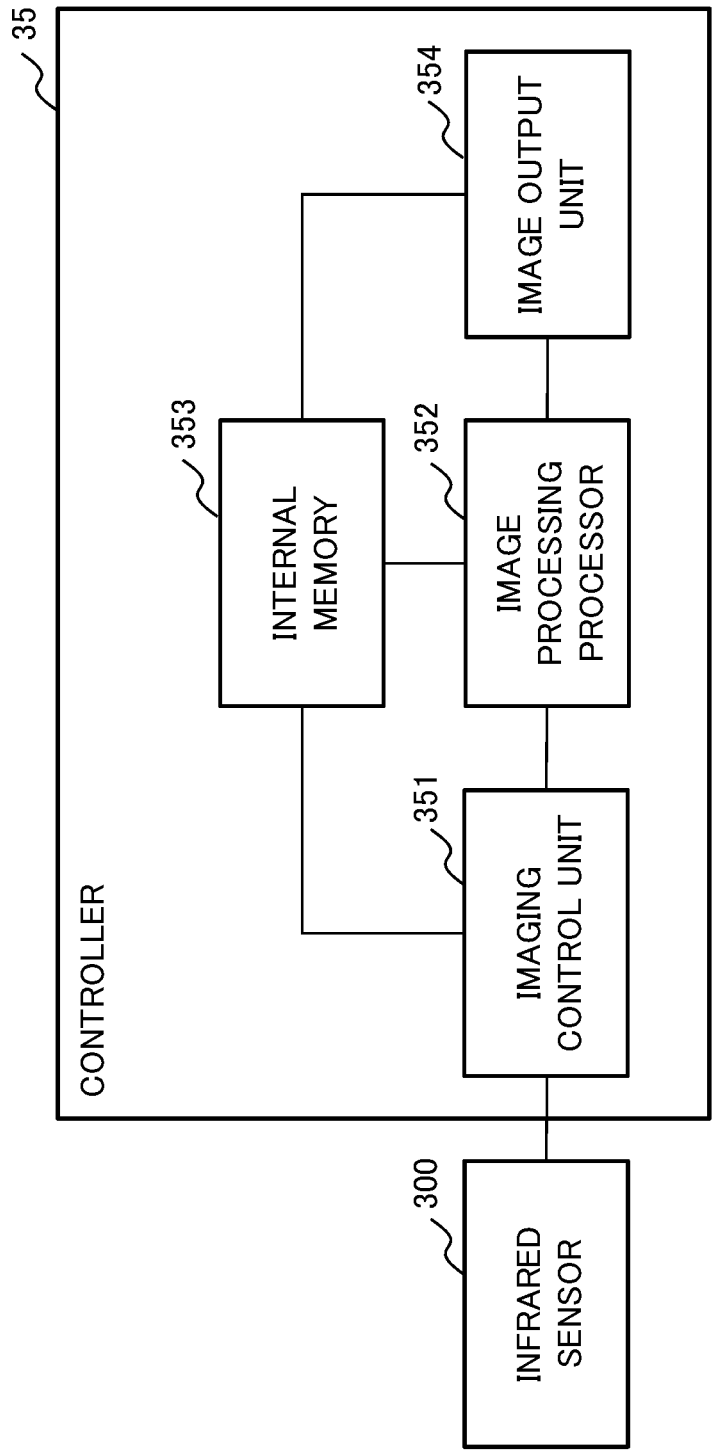
FIG. 19 is a block diagram illustrating an example of a detector of the imaging apparatus according to the third example embodiment.

The controller 35 acquires an electrical signal output from the infrared sensor 300, and generates image data associated to light received by the plurality of infrared detection elements included in the infrared sensor 300. The controller 35 may control the lens 31 or the cooler 33. FIG. 19 is a block diagram illustrating an example of a configuration of the controller 35. The controller 35 has an imaging control unit 351, an image processing processor 352, an internal memory 353, and an image output unit 354.

The imaging control unit 351 controls the infrared sensor 300 to capture an image of a range to be imaged, and acquires an electrical signal output from the infrared sensor 300. The imaging control unit 351 converts the acquired electrical signal into image data. The imaging control unit 351 outputs the converted image data to the image processing processor 352. In a case where it is not possible for the image processing processor 352 to complete the processing at a time, the imaging control unit 351 may temporarily store the converted image data in the internal memory 353.

The image processing processor 352 acquires, from the imaging control unit 351, image data based on the electrical signal output from the infrared sensor 300. The image processing processor 352 is an integrated circuit that executes, on the acquired image data, processing such as dark current correction, interpolation operation, color space conversion, gamma correction, aberration correction, noise reduction, and image compression. The image processing processor 352 outputs the image data that has undergone the image processing to the image output unit 354.

The internal memory 353 is a storage element for temporarily storing image information that the image processing processor 352 is not capable of processing at a time and processed image information. The internal memory 353 may be configured to temporarily store an electrical signal detected by the infrared sensor 300. The internal memory 353 can be constituted by a commonly used memory.

The image output unit 354 outputs image data processed by the image processing processor 352. An output destination to which the image output unit 354 outputs image data is not particularly limited. For example, the image output unit 354 outputs image data to a system (not illustrated) that uses image data imaged by the imaging apparatus 30. For example, the image output unit 354 causes a display unit (not illustrated) mounted on the imaging apparatus 30 to display image data. For example, the image output unit 354 causes a storage device (not illustrated) mounted on the imaging apparatus 30 to store image data.

As described above, the imaging apparatus of the present example embodiment includes the infrared sensor of the first or second example embodiment, a lens that condenses infrared light on a light receiving surface of the infrared sensor, a cooler that cools the infrared sensor, and a controller. The controller acquires an electrical signal output from the infrared sensor, and generates image data associated to light received by the plurality of infrared detection elements included in the infrared sensor. According to the present example embodiment, cracks are less likely to be generated in the detection substrate on which the infrared detection elements are formed, and thus sharp images can be captured stably.

The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. An infrared sensor comprising:
   a detection substrate that includes a first substrate in which a plurality of infrared detection elements are arranged in a lattice shape and a plurality of first terminals each of which is associated with one of the infrared detection elements are arranged;
   a readout substrate that includes a second substrate in which a plurality of second terminals each of which is associated with one of the plurality of first terminals are arranged and a readout circuit that reads an electrical signal based on infrared light detected by each one of the plurality of infrared detection elements is formed; and
   a plurality of bumps that electrically connects each one of the plurality of first terminals to one of the plurality of second terminals associated with the one of the plurality of first terminals, wherein
   at least one of the plurality of first terminals, the plurality of second terminals, or the plurality of bumps is partially arranged at a position between the infrared detection elements that are adjacent in a top view.

2. The infrared sensor according to claim 1, wherein
   at least one of the plurality of bumps is partially arranged at a position in a gap formed between the plurality of first terminals and the plurality of second terminals.

3. The infrared sensor according to claim 1, wherein
   at least one of the plurality of bumps is arranged to be shifted from centers of the plurality of infrared detection elements within a range from equal to or more than 10% to equal to or less than 50% of a pitch size of the plurality of infrared detection elements.

4. The infrared sensor according to claim 2, wherein
   the first substrate and the second substrate are rectangular, and
   at least one of the plurality of bumps is arranged to be shifted in a longitudinal direction of the first substrate and the second substrate.

5. The infrared sensor according to claim 2, wherein
   every one of the plurality of bumps is arranged at a position in a gap formed between the plurality of first terminals and the plurality of second terminals.

6. The infrared sensor according to claim 2, wherein
   the plurality of first terminals and the plurality of second terminals are deformed in accordance with shifts of the plurality of bumps.

7. The infrared sensor according to claim 1, wherein
   at least one of sets of the plurality of first terminals and the plurality of second terminals associated with each other is arranged at a position between the infrared detection elements that are adjacent to each other in a top view.

8. The infrared sensor according to claim 7, wherein
   corners of the plurality of first terminals and the plurality of second terminals are deformed to avoid electrical contact with the plurality of first terminals and the plurality of second terminals that are adjacent to the corners.

9. The infrared sensor according to claim 7, wherein
   the first substrate and the second substrate are rectangular, and
   at least one of sets of the plurality of first terminals and the plurality of second terminals associated with each other is arranged to be shifted in a longitudinal direction of the first substrate and the second substrate.

10. An imaging apparatus comprising:
    the infrared sensor according to claim 1;
    a lens that condenses infrared light on a light receiving surface of the infrared sensor;
    a cooler that cools the infrared sensor; and
    a controller configured to acquire an electrical signal output from the infrared sensor, and generate image data associated to light received by the plurality of infrared detection elements included in the infrared sensor.

* * * * *